(12) United States Patent
Wang et al.

(10) Patent No.: US 12,408,394 B2
(45) Date of Patent: Sep. 2, 2025

(54) SEMICONDUCTOR DEVICE STRUCTURE AND METHOD FOR FORMING THE SAME

(71) Applicant: Taiwan Semiconductor Manufacturing Company, Ltd., Hsinchu (TW)

(72) Inventors: Sheng-Tsung Wang, Hsinchu (TW); Lin-Yu Huang, Hsinchu (TW); Min-Hsuan Lu, Hsinchu (TW); Chia-Hung Chu, Taipei (TW); Shuen-Shin Liang, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 574 days.

(21) Appl. No.: 17/815,854

(22) Filed: Jul. 28, 2022

(65) Prior Publication Data
US 2024/0038839 A1    Feb. 1, 2024

(51) Int. Cl.
*H10D 62/10* (2025.01)
*H01L 21/285* (2006.01)
*H01L 21/311* (2006.01)
*H10D 30/67* (2025.01)

(52) U.S. Cl.
CPC ..... *H10D 62/118* (2025.01); *H01L 21/28518* (2013.01); *H01L 21/31111* (2013.01); *H10D 30/6735* (2025.01)

(58) Field of Classification Search
CPC ............. H10D 62/118; H10D 30/6735; H10D 30/6757; H10D 64/017; H01L 21/28518; H01L 21/76877
See application file for complete search history.

(56) References Cited

U.S. PATENT DOCUMENTS

| | | |
|---|---|---|
| 9,209,247 B2 | 12/2015 | Colinge et al. |
| 9,236,267 B2 | 1/2016 | De et al. |
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |

(Continued)

*Primary Examiner* — Bac H Au
(74) *Attorney, Agent, or Firm* — McClure, Qualey & Rodack, LLP

(57) ABSTRACT

A method for forming a semiconductor device structure includes forming nanostructures over a front side of a substrate. The method also includes forming a gate structure surrounding the nanostructures. The method also includes forming a source/drain structure beside the gate structure. The method also includes forming a trench though the substrate from a back side of the substrate. The method also includes forming a first silicide layer in contact with the source/drain structure. The method also includes forming a second silicide layer over the first silicide layer and the sidewalls of the trench. The method also includes depositing a first conductive material over the second silicide layer. The method also includes etching back the first conductive material. The method also includes etching back the second silicide layer. The method also includes depositing a second conductive material in the trench.

20 Claims, 31 Drawing Sheets

(56) References Cited

U.S. PATENT DOCUMENTS

| | | | |
|---|---|---|---|
| 9,608,116 B2 | 3/2017 | Ching et al. | |
| 11,011,611 B2* | 5/2021 | Hung | H01L 21/32053 |
| 11,935,834 B2* | 3/2024 | Huang | H01L 21/76877 |
| 2016/0307758 A1* | 10/2016 | Li | H01L 21/0217 |
| 2021/0336019 A1* | 10/2021 | Su | H10D 30/6735 |
| 2022/0359396 A1* | 11/2022 | Wang | H01L 21/31116 |
| 2023/0009144 A1* | 1/2023 | Lin | H01L 21/02126 |
| 2023/0042548 A1* | 2/2023 | Yang | H10D 84/038 |
| 2023/0378260 A1* | 11/2023 | Fung | H10D 30/031 |
| 2023/0387200 A1* | 11/2023 | Huang | H10D 62/118 |
| 2023/0402522 A1* | 12/2023 | Yu | H10D 62/121 |
| 2023/0402546 A1* | 12/2023 | Yu | H10D 62/364 |
| 2023/0420455 A1* | 12/2023 | Yu | H10D 84/0149 |
| 2024/0006479 A1* | 1/2024 | Yu | H10D 64/018 |
| 2024/0021708 A1* | 1/2024 | Lan | H10D 84/038 |

* cited by examiner

SEMICONDUCTOR DEVICE STRUCTURE AND METHOD FOR FORMING THE SAME

BACKGROUND

Semiconductor devices are used in a variety of electronic applications, such as personal computers, cell phones, digital cameras, and other electronic equipment. Semiconductor devices are typically fabricated by sequentially depositing insulating or ILD structures, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, for example, or in other types of packaging.

Recently, multi-gate devices have been introduced in an effort to improve gate control by increasing gate-channel coupling, reduce OFF-state current, and reduce short-channel effects (SCEs). One such multi-gate device that has been introduced is the gate-all around transistor (GAA). The GAA device gets its name from the gate structure which can extend around the channel region providing access to the channel on two or four sides. GAA devices are compatible with conventional complementary metal-oxide-semiconductor (CMOS) processes.

However, integration of fabrication of the GAA features around the nanowire can be challenging. While the current methods have been satisfactory in many respects, continued improvements are still needed.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
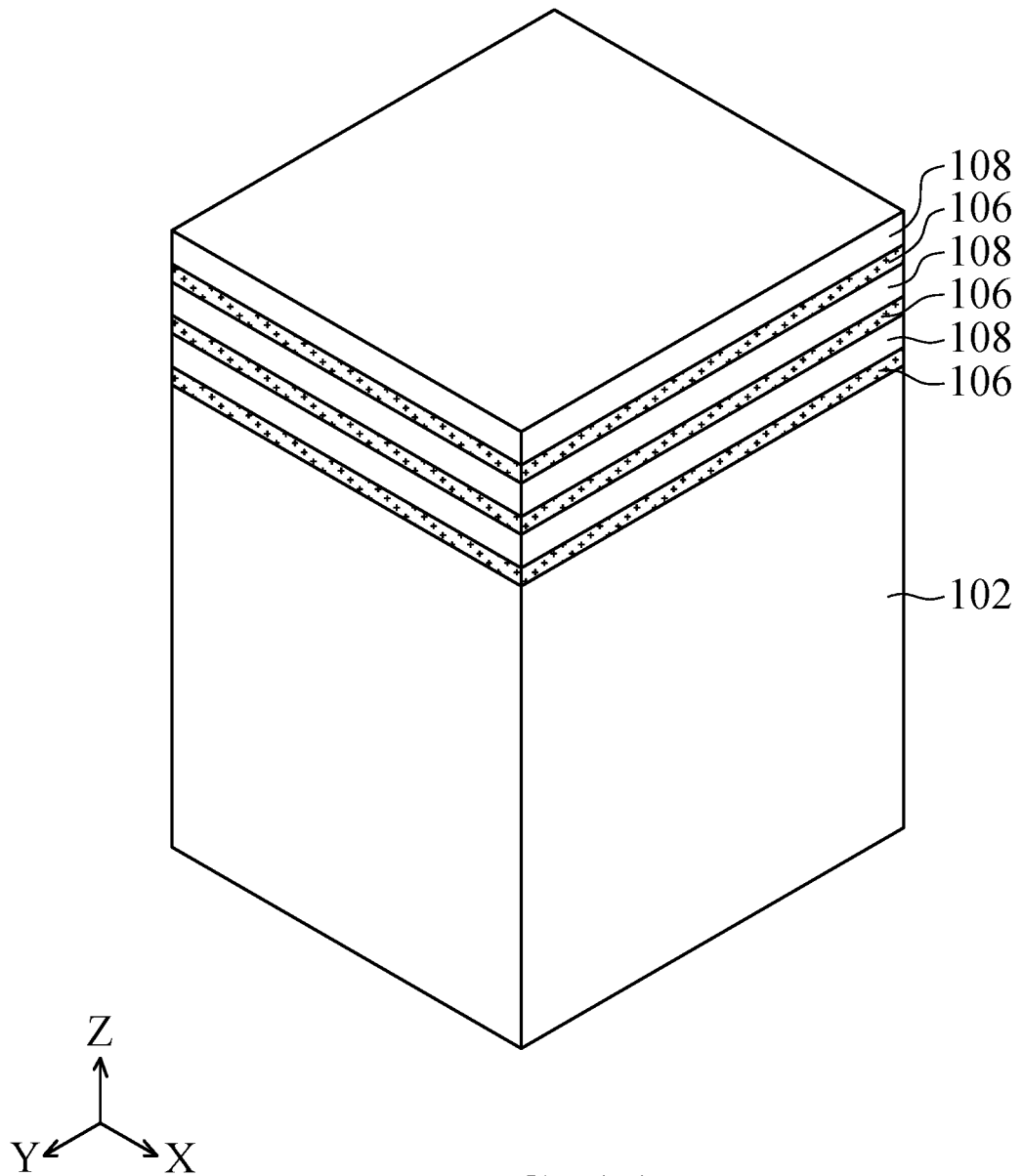
FIGS. 1A-1N are perspective representations of various stages of forming a semiconductor device structure, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and after the method, and some of the operations described can be replaced or eliminated for other embodiments of the method.

The nanostructure transistor (e.g. nanosheet transistor, nanowire transistor, multi-bridge channel, nano-ribbon FET, gate all around (GAA) transistor structures) described below may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, smaller pitches than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Embodiments for forming a semiconductor device structure are provided. The method for forming the semiconductor device structure may include forming a back-side source/drain contact structure by a two-step etching back process. The back-side source/drain contact structure may be formed by a bottom-up deposition process. The resistance may be minimized. In addition, the defect such as selective loss or void in the back-side source/drain contact structure may be prevented.

Figure 1B:
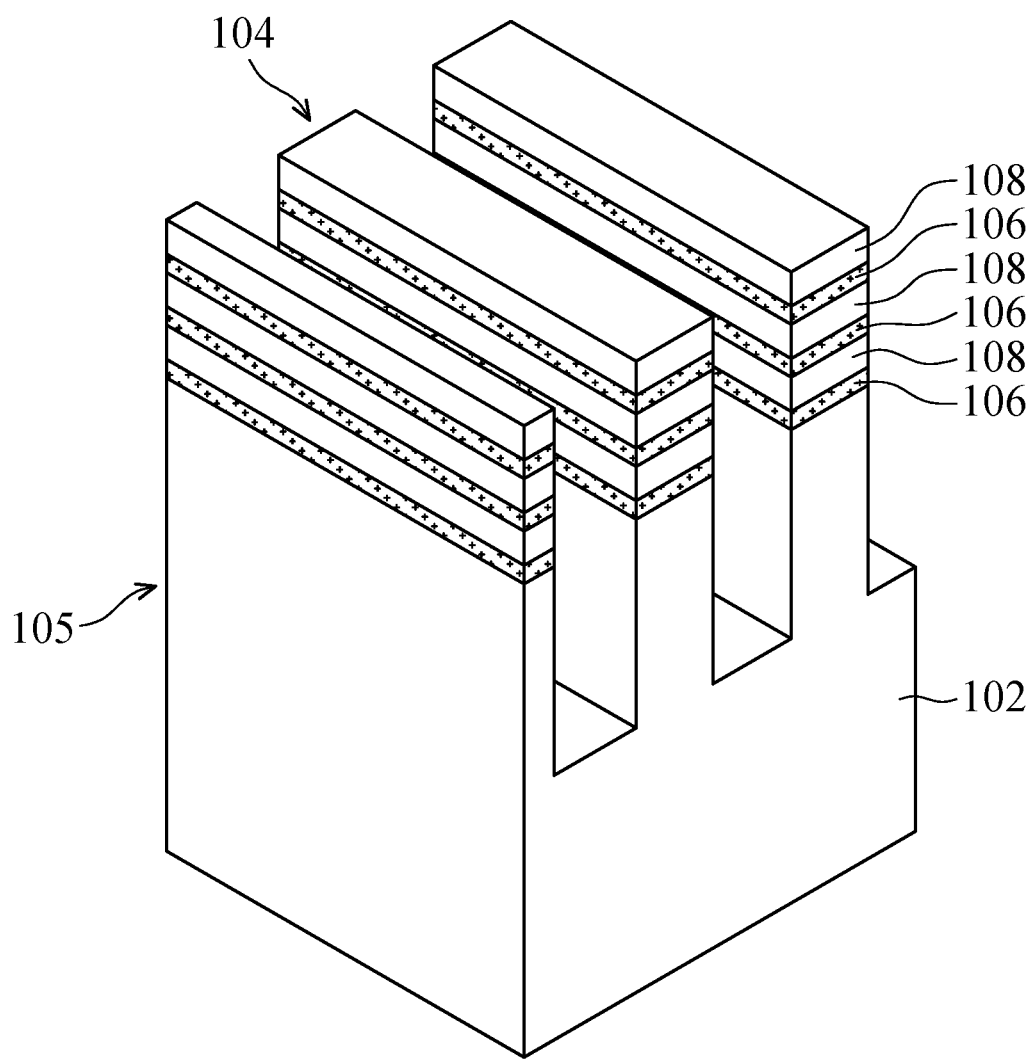
FIGS. 1O-1W are cross-sectional representations of various stages of forming a semiconductor device structure, in accordance with some embodiments of the disclosure.
Figure 1C:
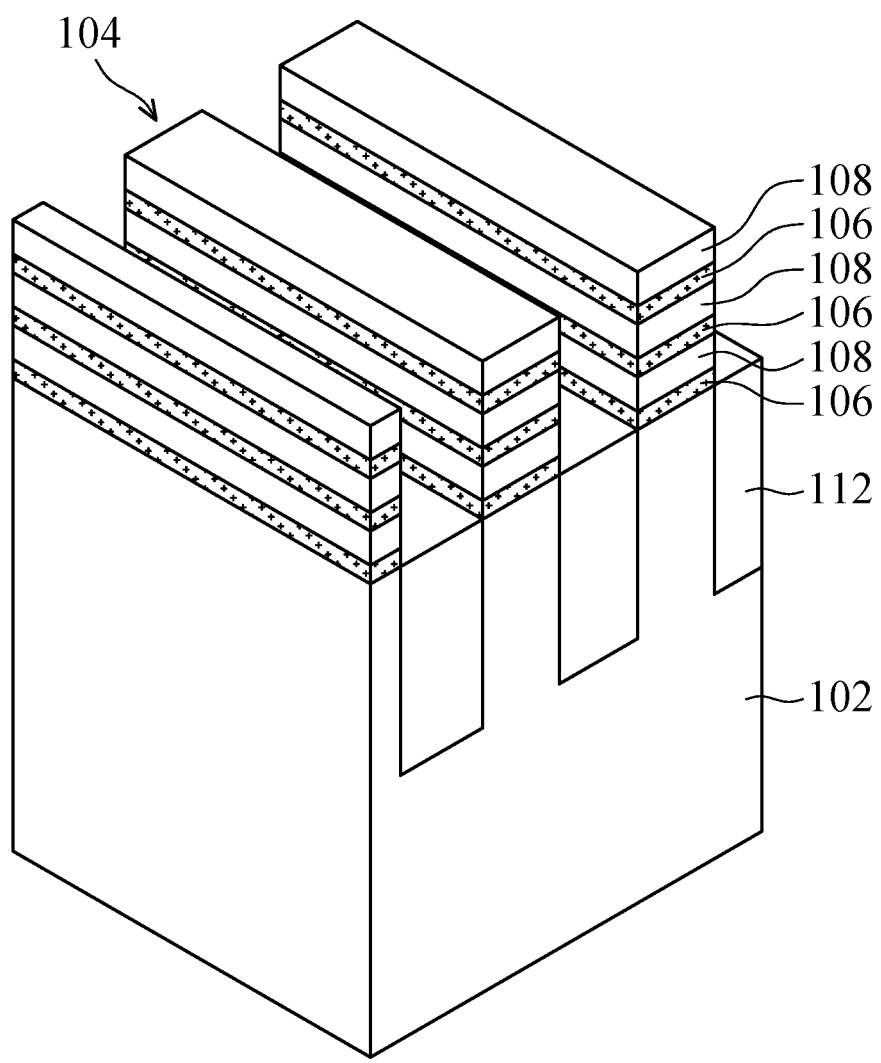
Figure 1D:
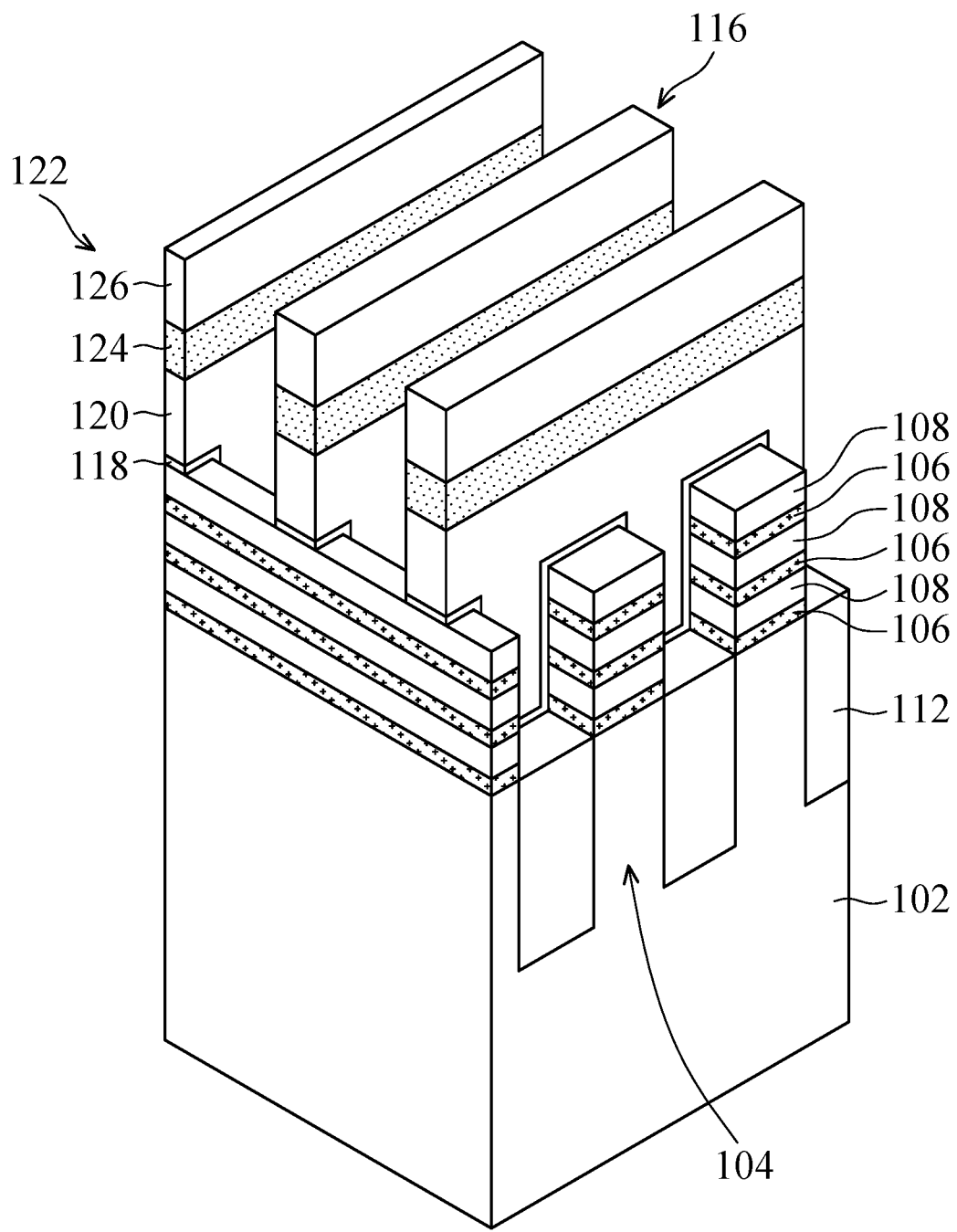
Figure 1E:
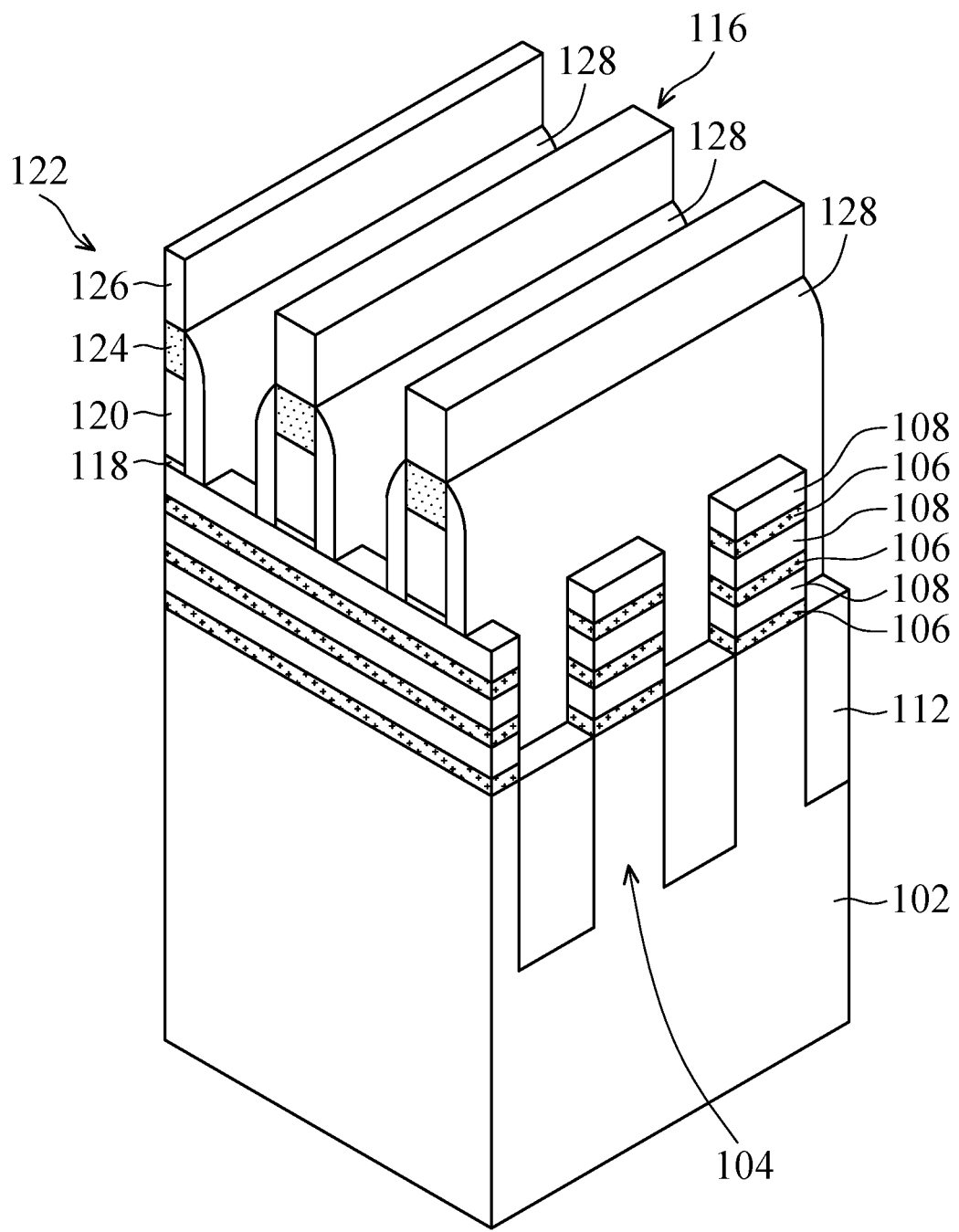
Figure 1F:
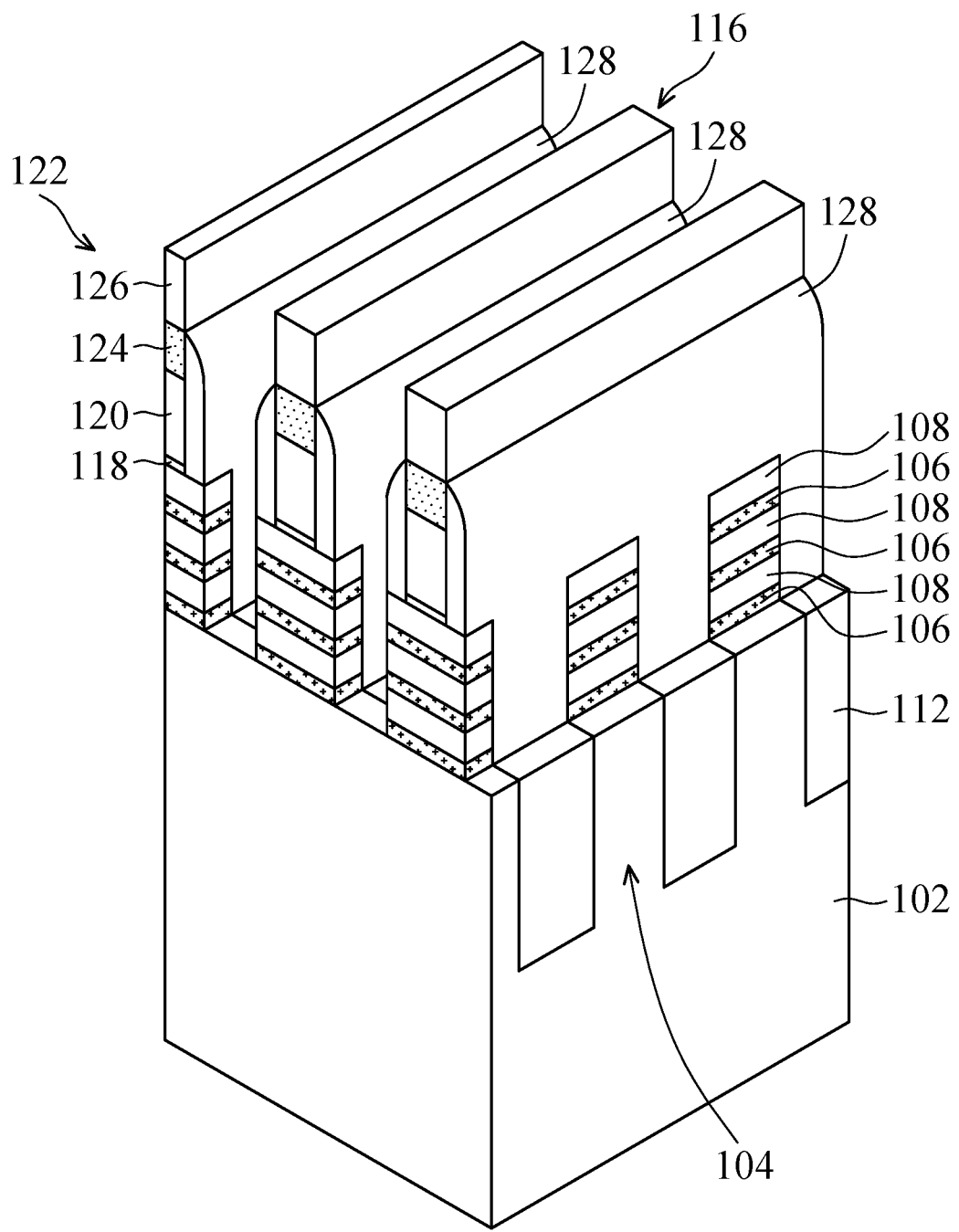
Figure 1G:
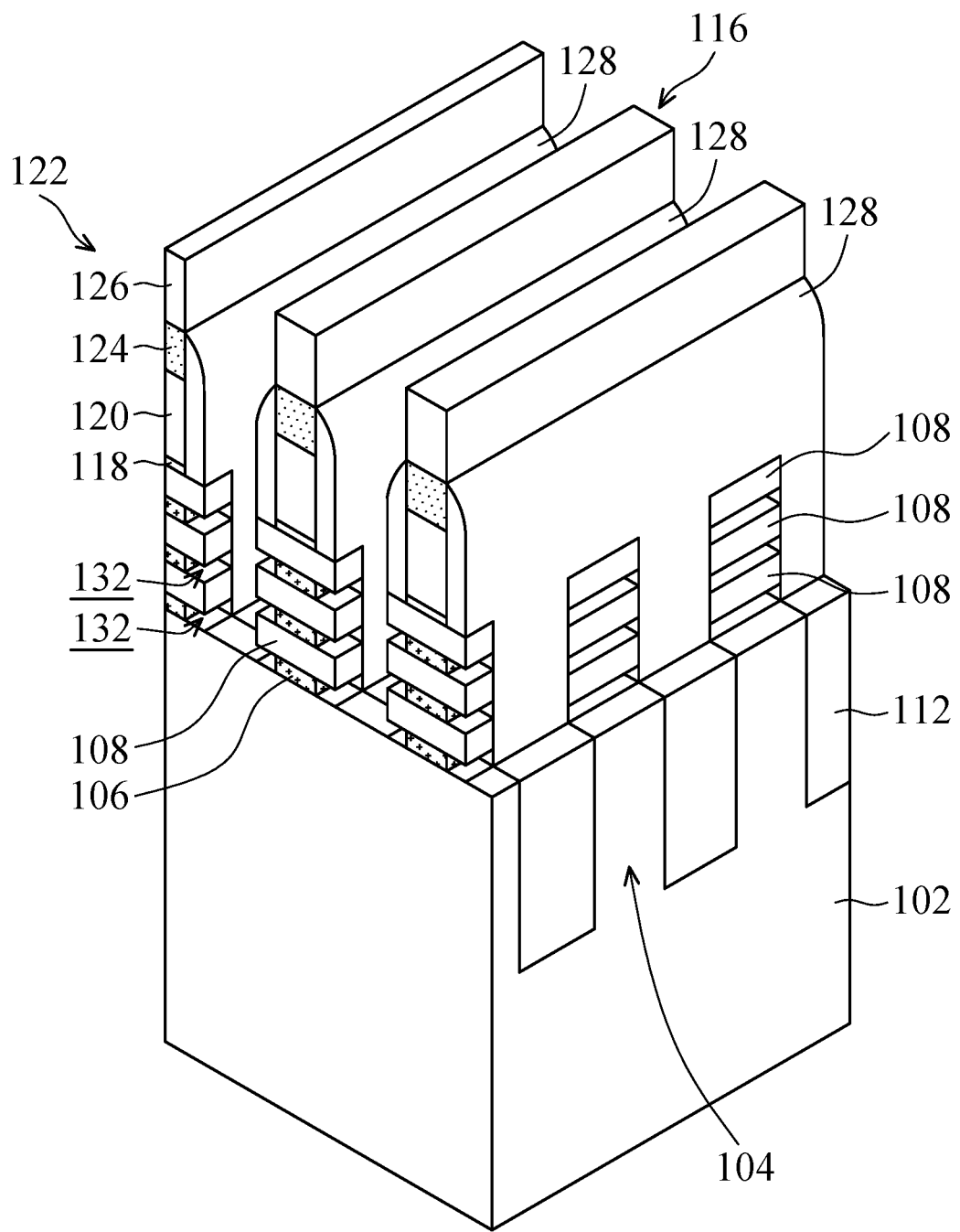
Figure 1H:
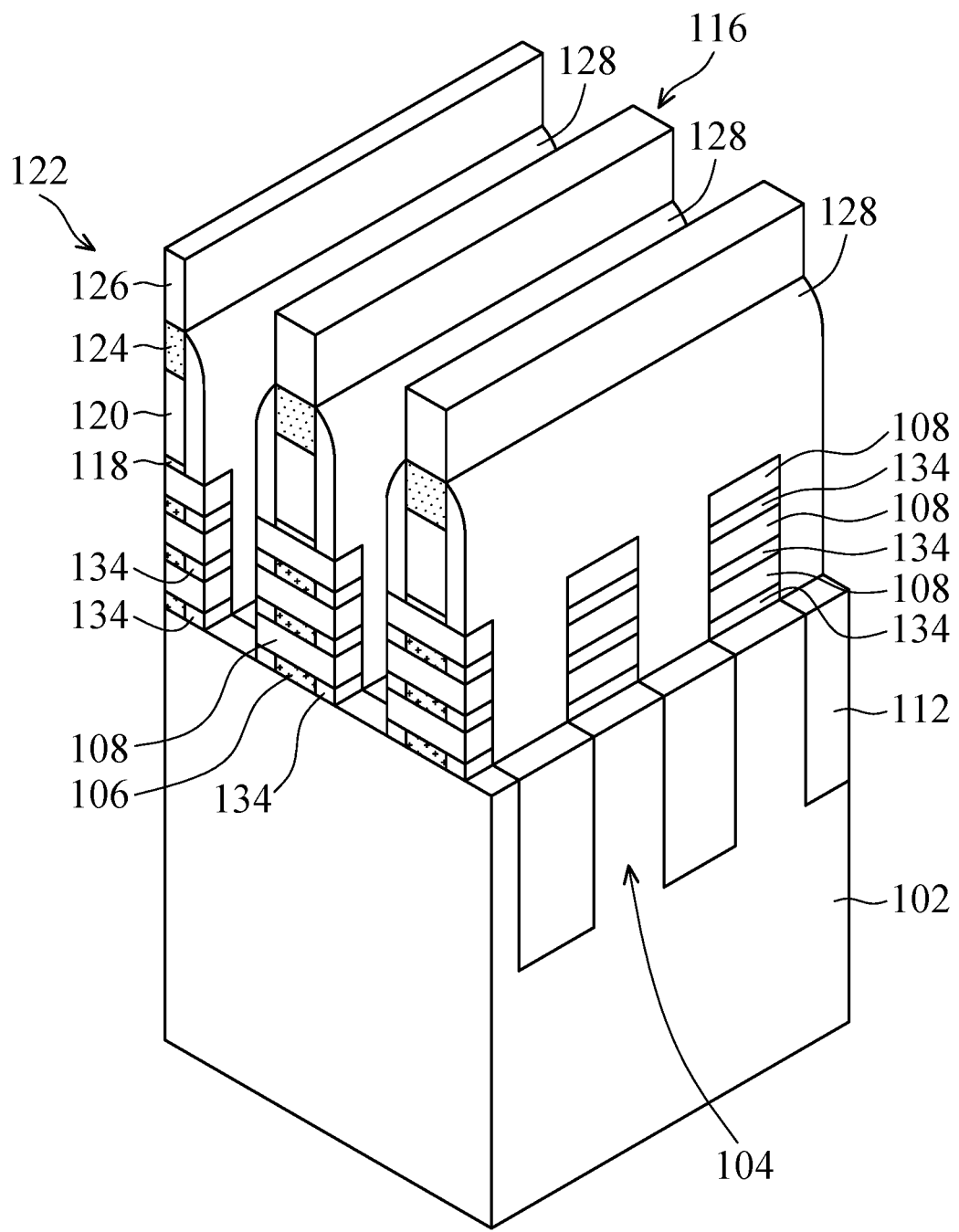
Figure 1I:
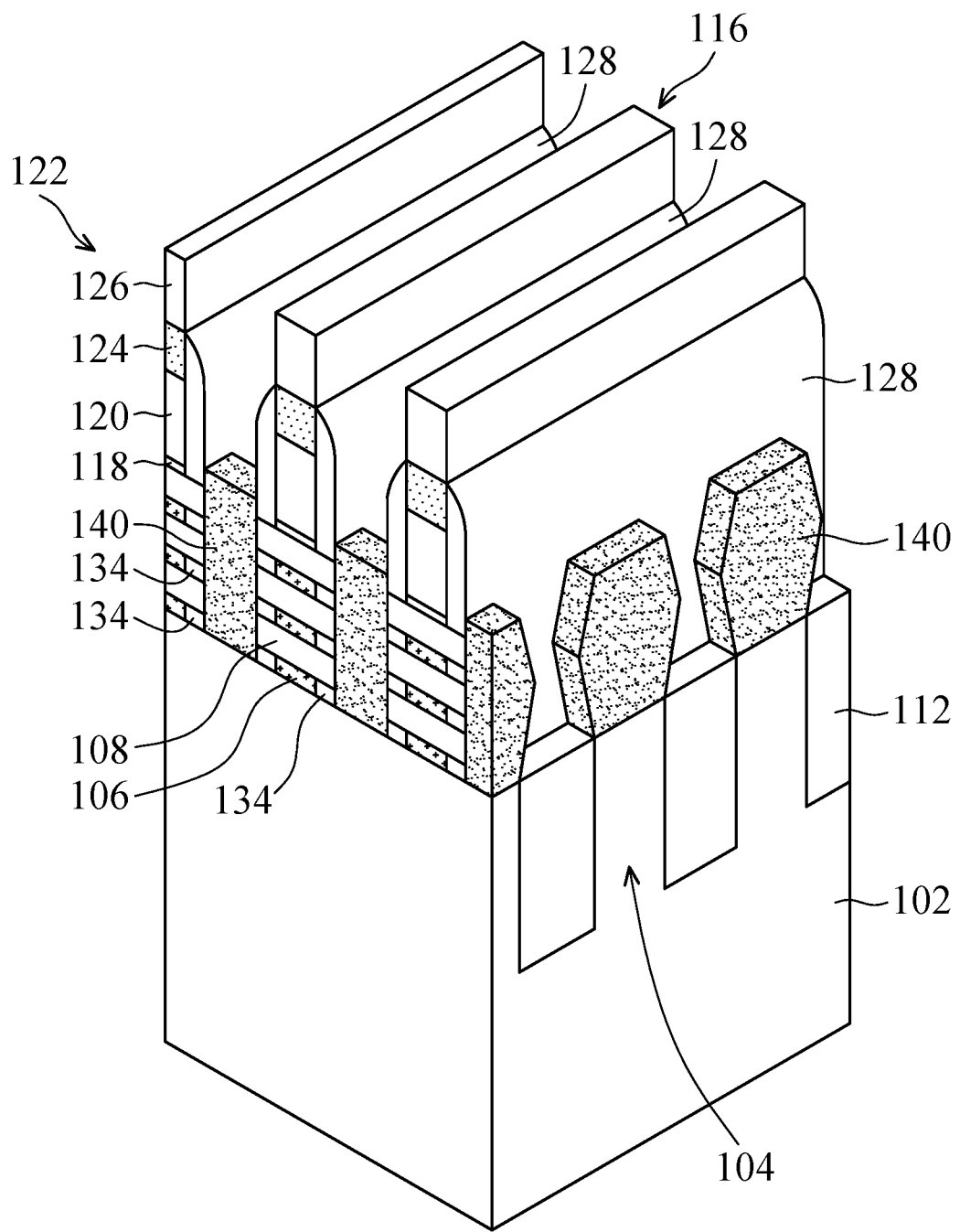
Figure 1J:
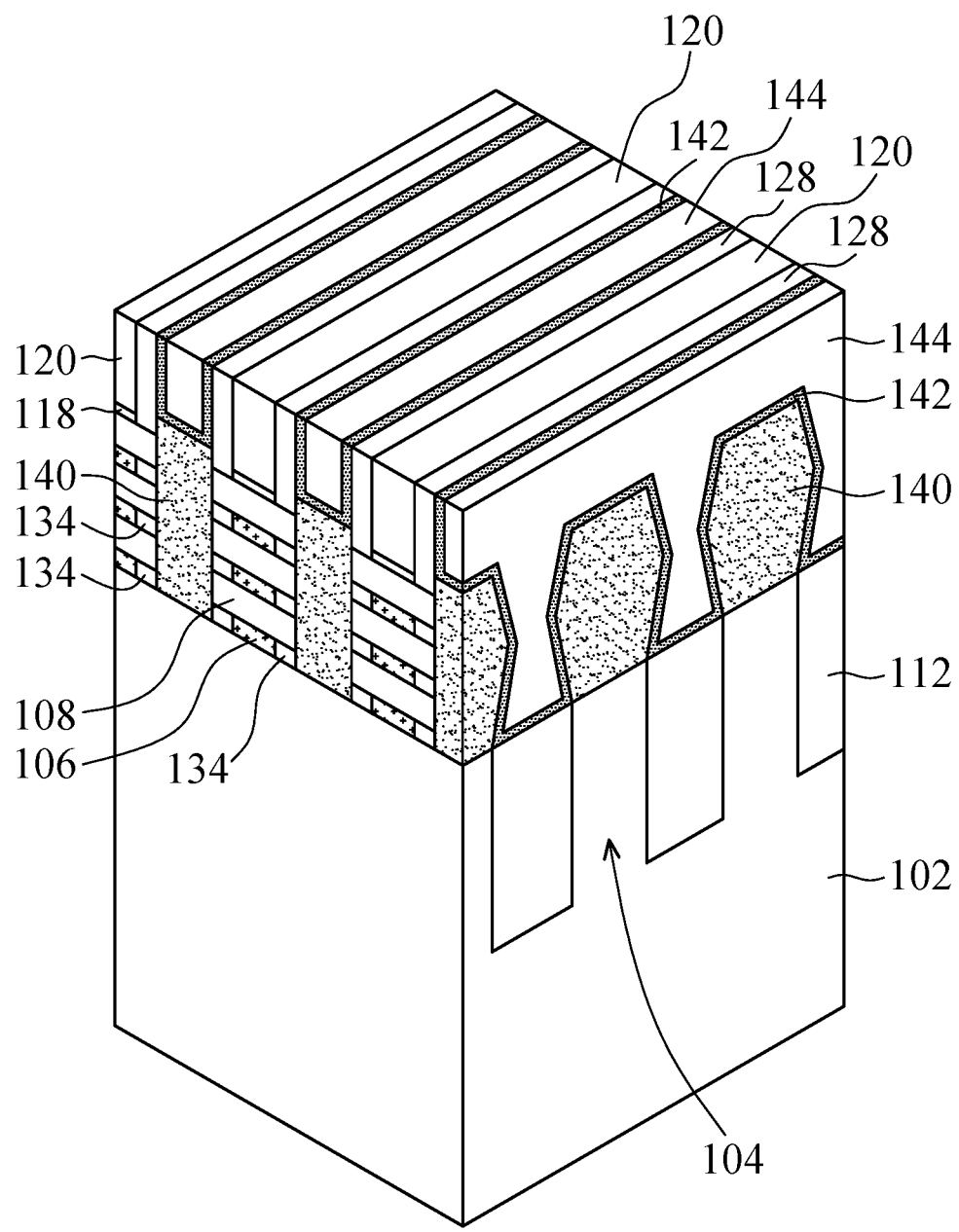
Figure 1K:
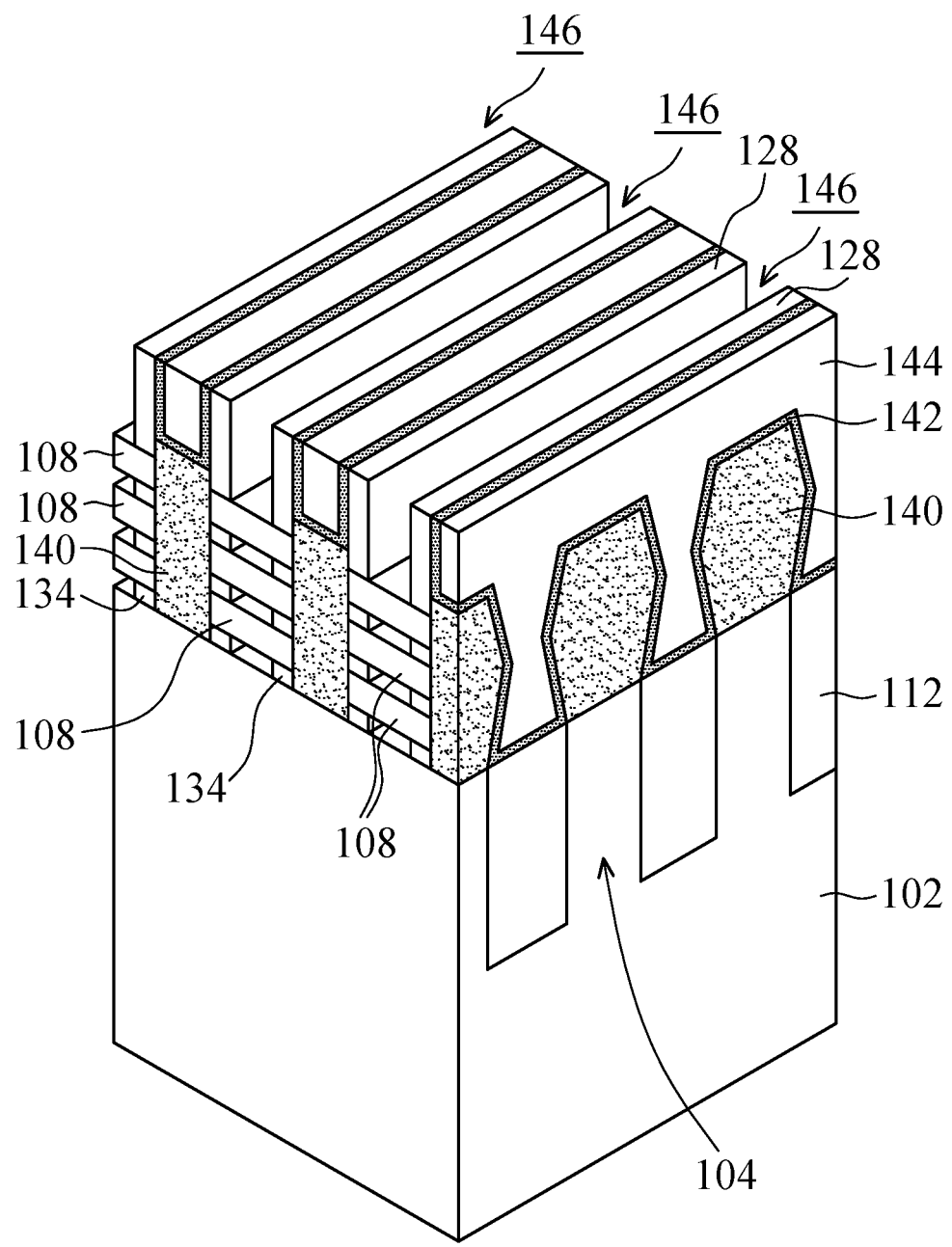
Figure 1L:
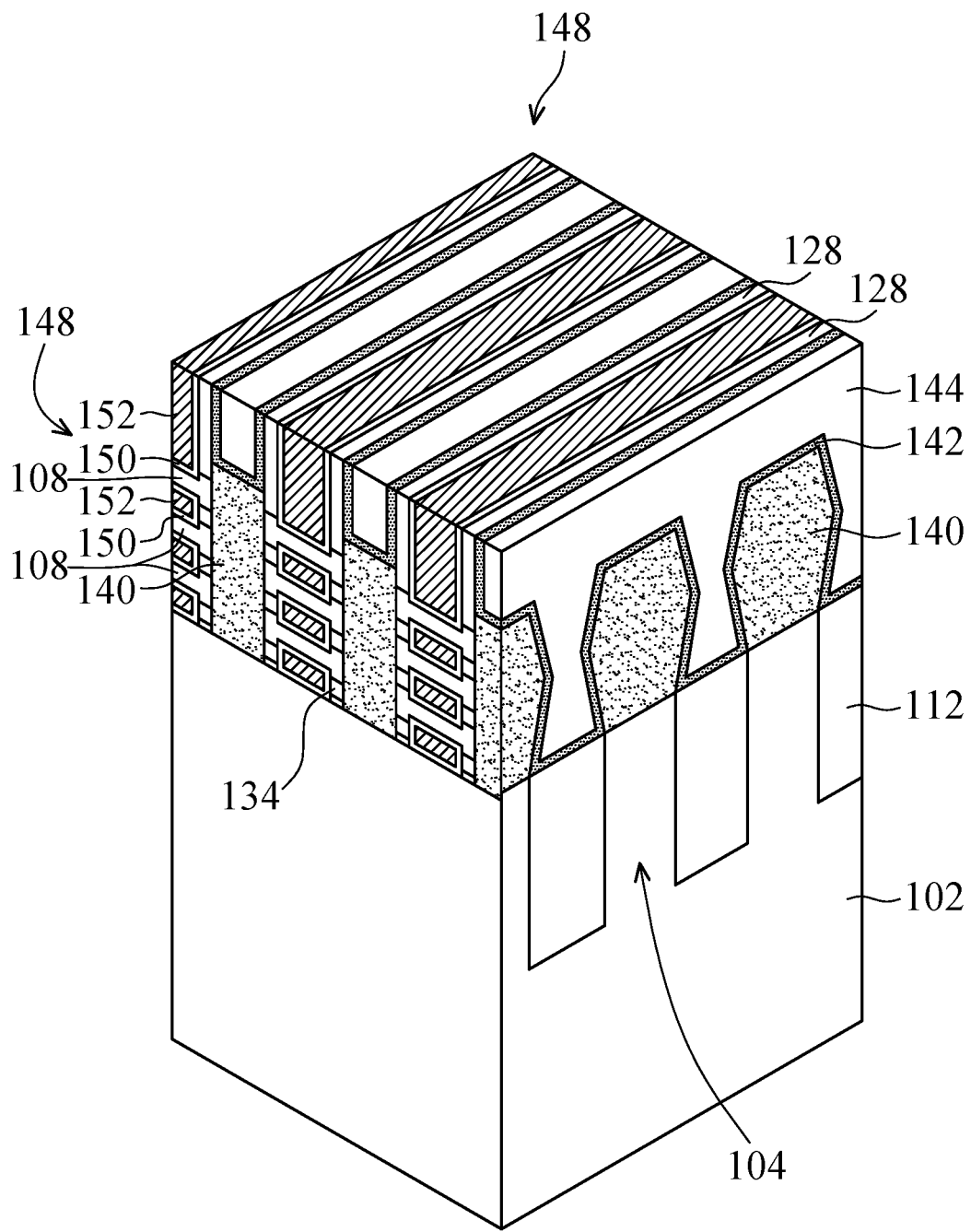
Figure 1M:
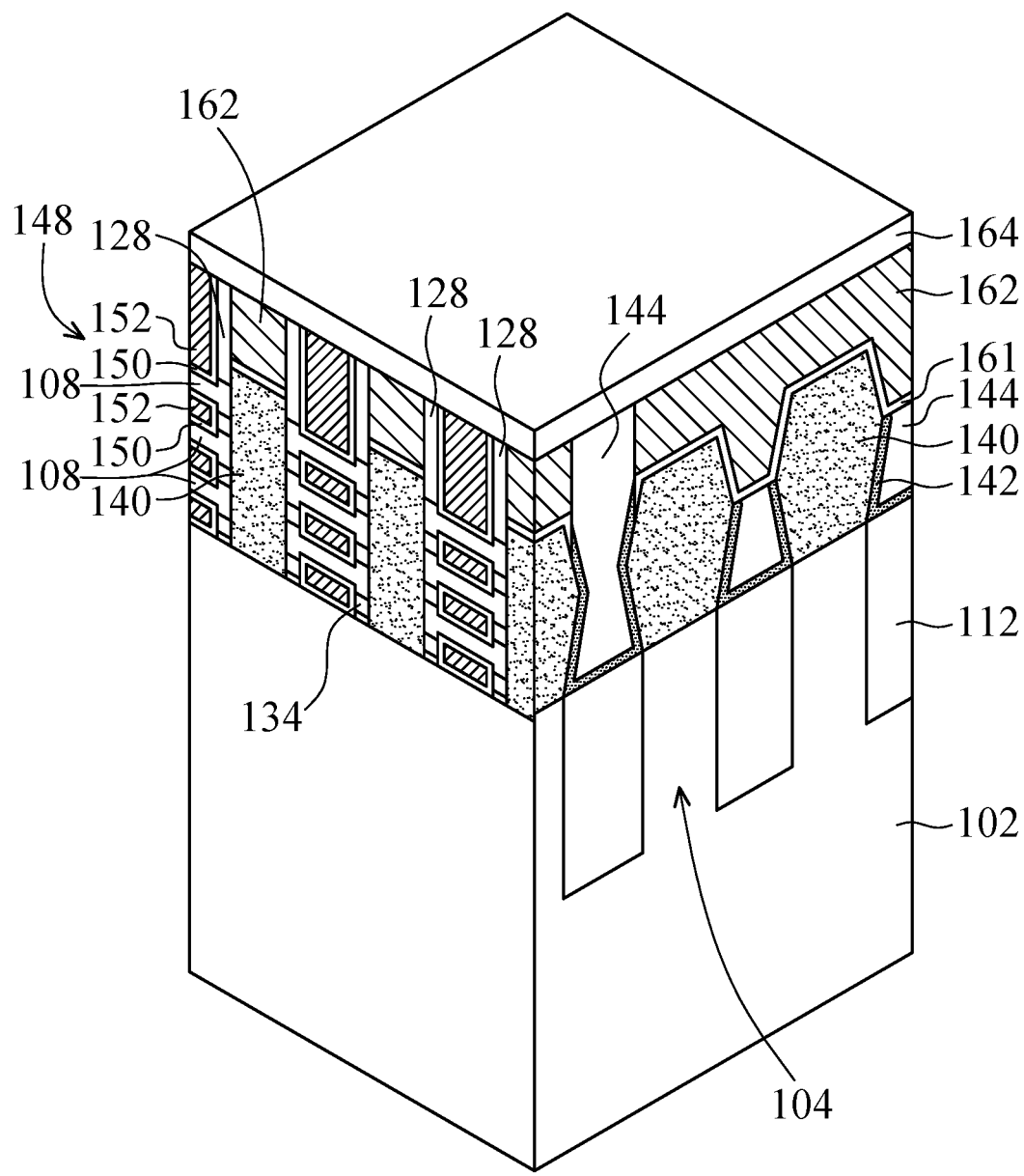
Figure 1N:
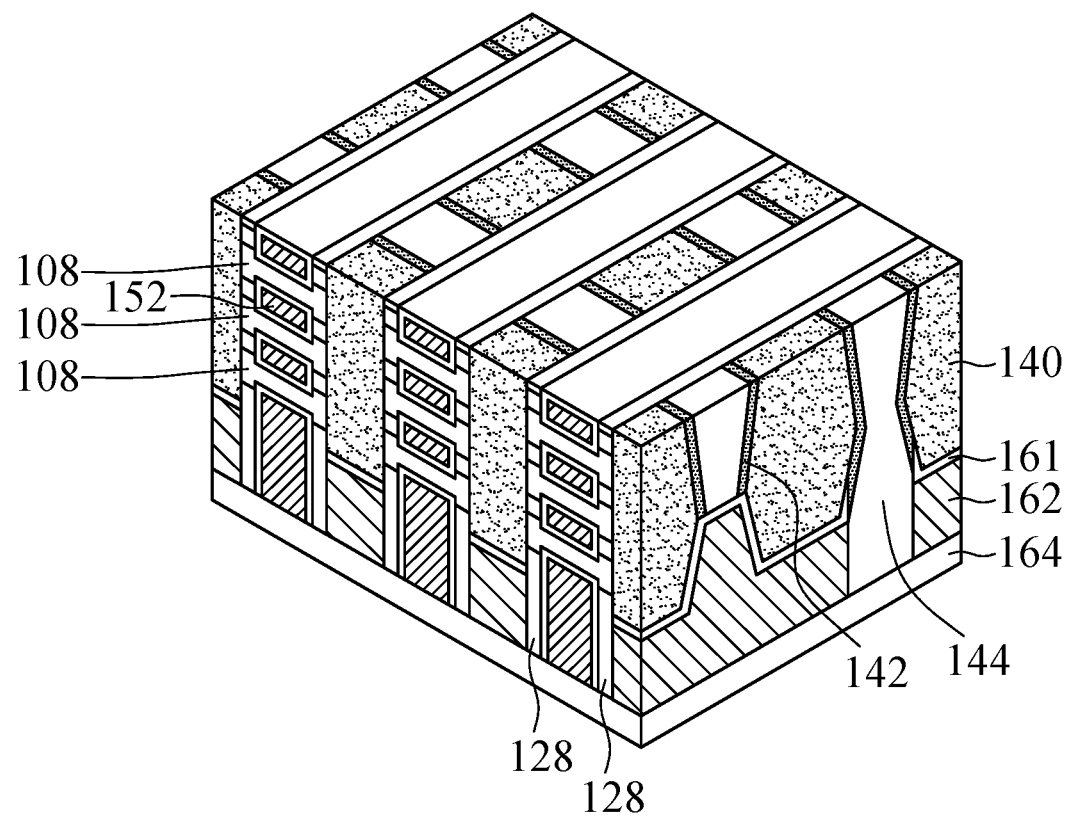

FIGS. 1A-1N are perspective representations of various stages of forming a semiconductor device structure 10a, in accordance with some embodiments of the disclosure. The semiconductor device structure 10a may be a gate all around (GAA) transistor structure. FIGS. 1O-1W are cross-sectional representations of various stages of forming a semiconductor device structure 10a, in accordance with some embodiments of the disclosure.

A semiconductor stack including first semiconductor material layers 106 and second semiconductor material layers 108 are formed over a substrate 102, as shown in FIG. 1A in accordance with some embodiments. The substrate 102 may be a semiconductor wafer such as a silicon wafer. The substrate 102 may also include other elementary semiconductor materials, compound semiconductor materials, and/or alloy semiconductor materials. Examples of the elementary semiconductor materials may include, but are not limited to, crystal silicon, polycrystalline silicon, amorphous silicon, germanium, and/or diamond. Examples of the compound semiconductor materials may include, but are not limited to, silicon carbide, gallium nitride, gallium arsenic, gallium phosphide, indium phosphide, indium arsenide, and/or indium antimonide. Examples of the alloy semiconductor materials may include, but are not limited to, SiGe, GaAsP, AlInAs, AlGaAs, GaInAs, GaInP, and/or GaInAsP. The substrate 102 may include an epitaxial layer. For example, the substrate 102 may be an epitaxial layer overlying a bulk semiconductor. In addition, the substrate 102 may also be semiconductor on insulator (SOI). The SOI substrate may be fabricated by a wafer bonding process, a silicon film transfer process, a separation by implantation of oxygen (SIMOX) process, other applicable methods, or a combination thereof. The substrate 102 may be an N-type substrate. The substrate 102 may be a P-type substrate.

Next, first semiconductor material layers 106 and second semiconductor material layers 108 are alternating stacked over the substrate 102 to form the semiconductor stack, as shown in FIG. 1A in accordance with some embodiments. The first semiconductor material layers 106 and the second semiconductor material layers 108 may include Si, Ge, SiGe, GaAs, InSb, GaP, GaSb, InAlAs, InGaAs, GaSbP, GaAsSb, or InP. The first semiconductor material layers 106 and second semiconductor material layers 108 may be made of different materials with different etching rates. In some embodiments, for example, the first semiconductor material layers 106 are made of SiGe and the second semiconductor material layers 108 are made of Si.

The first semiconductor material layers 106 and second semiconductor material layers 108 may be formed by low pressure chemical vapor deposition (LPCVD) process, epitaxial growth process, other applicable methods, or a combination thereof. The epitaxial growth process may include molecular beam epitaxy (MBE), metal organic chemical vapor deposition (MOCVD), or vapor phase epitaxy (VPE).

It should be noted that, although there are three layers of the first semiconductor material layers 106 and three layers of the second semiconductor material layers 108 shown in FIG. 1A, the number of the first semiconductor material layers 106 and second semiconductor material layers 108 are not limited herein, depending on the demand of performance and process. For example, the semiconductor structure may include two to six layers of the first semiconductor material layers 106 and two to six layers of the second semiconductor material layers 108.

Next, a mask structure may be formed over the first semiconductor material layers 106, as shown in FIG. 1A in accordance with some embodiments. The mask structure may be made of silicon nitride, silicon carbon nitride (SiCN), or applicable material. The mask structure may be formed by a deposition process, such as low-pressure CVD (LPCVD) process, plasma enhanced CVD (PECVD) process, or another deposition process.

After the first semiconductor material layers 106 and the second semiconductor material layers 108 are formed as the semiconductor material stack over the substrate 102, the semiconductor material stack is patterned to form fin structures 104 using the mask structure as a mask layer, as shown in FIG. 1B in accordance with some embodiments. The fin structures 104 may include the base fin structures 105 and the semiconductor material stacks, including the first semiconductor material layers 106 and the second semiconductor material layers 108, formed over the base fin structures 105.

The patterning process may including forming a mask structure over the first semiconductor material layers 106 and the second semiconductor material layers 108 and etching the semiconductor material stack and the underlying substrate 102 through the mask structure, as shown in FIG. 1B in accordance with some embodiments. The mask structure may be a multilayer structure including a pad layer and a hard mask layer formed over the pad layer. The pad layer may be made of silicon oxide, which may be formed by thermal oxidation or CVD. The hard mask layer may be made of silicon nitride, which may be formed by CVD, such as LPCVD or plasma-enhanced CVD (PECVD).

The patterning process of forming the fin structures 104 may include a photolithography process and an etching process. The photolithography process may include photoresist coating (e.g., spin-on coating), soft baking, mask aligning, exposure, post-exposure baking, developing the photoresist, rinsing and drying (e.g., hard baking). The etching process may include a dry etching process or a wet etching process.

After the fin structures 104 are formed, a liner layer may be formed over the fin structures 104 and in the trenches between the fin structures 104. The liner layer may be conformally formed over the substrate 102, the fin structure 110, and the mask structure covering the fin structure 110. The liner layer may be used to protect the fin structure 110 from being damaged in the following processes (such as an anneal process or an etching process). The liner layer may be made of silicon nitride. The liner layer may be formed by using a thermal oxidation, a CVD process, an atomic layer deposition (ALD) process, a LPCVD process, a plasma enhanced CVD (PECVD) process, a HDPCVD process, a flowable CVD (FCVD) process, another applicable process, or a combination thereof.

Next, an isolation structure material 112 is then filled into the trenches between the fin structures 104 and over the liner layer, as shown in FIG. 1C in accordance with some embodiments. The isolation structure material 112 may be made of silicon oxide, silicon nitride, silicon oxynitride (SiON), fluoride-doped silicate glass (FSG), other low-k dielectric materials, or a combination thereof. The isolation structure material 112 may be deposited using a deposition process, such as a chemical vapor deposition (CVD) process (e.g. a flowable CVD (FCVD) process), a spin-on-glass process, or another applicable process.

Next, the isolation structure material 112 and the liner layer are etched back using an etching process, and an isolation structure 112 is formed surrounding the base fin structure, as shown in FIG. 1C in accordance with some embodiments. The etching process may be used to remove the top portion of the liner layer and the top portion of the isolation structure material 112. As a result, the first semiconductor material layers 106 and the second semiconductor material layers 108 may be exposed. The isolation structure 112 may be a shallow trench isolation (STI) structure. The isolation structure 112 may be configured to electrically isolate active regions such as fin structures 104 of the semiconductor structure 10a and prevent electrical interference and crosstalk.

Next, a dummy gate structure 116 is formed over and across the fin structures 104, as shown in FIG. 1D in accordance with some embodiments. The dummy gate structure 116 may be used to define the source/drain regions and the channel regions of the resulting semiconductor structure 10a. The dummy gate structure 116 may include a dummy gate dielectric layer 118 and a dummy gate electrode layer 120. The dummy gate dielectric layer 118 and the dummy gate electrode layer 120 may be replaced by the following steps to form a real gate structure with a high-k dielectric layer and a metal gate electrode layer.

The dummy gate dielectric layer 118 may include one or more dielectric materials, such as silicon oxide, silicon nitride, silicon oxynitride (SiON), $HfO_2$, HfZrO, HfSiO, HfTiO, HfAlO, or a combination thereof. The dummy gate dielectric layer 118 may be formed by an oxidation process (e.g., a dry oxidation process, or a wet oxidation process), a chemical vapor deposition process, other applicable processes, or a combination thereof. Alternatively, the dummy gate dielectric layer 118 may include a high-k dielectric layer (e.g., the dielectric constant is greater than 3.9) such as hafnium oxide ($HfO_2$). Alternatively, the high-k dielectric layer may include other high-k dielectrics, such as LaO, AlO, ZrO, TiO, $Ta_2O_5$, $Y_2O_3$, $SrTiO_3$, $BaTiO_3$, BaZrO, HfZrO, HfLaO, HfTaO, HfSiO, HfSiON, HfTiO, LaSiO, AlSiO, (Ba, Sr)$TiO_3$, $Al_2O_3$, other applicable high-k dielectric materials, or a combination thereof. The high-k dielectric layer may be formed by a chemical vapor deposition process (e.g., a plasma enhanced chemical vapor deposition (PECVD) process, or a metalorganic chemical vapor deposition (MOCVD) process), an atomic layer deposition (ALD) process (e.g., a plasma enhanced atomic layer deposition (PEALD) process), a physical vapor deposition (PVD) process (e.g., a vacuum evaporation process, or a sputtering process), other applicable processes, or a combination thereof.

The dummy gate electrode layer 120 may include polycrystalline-silicon (poly-Si), poly-crystalline silicon-germanium (poly-SiGe), other applicable materials, or a combination thereof. The dummy gate electrode layer 120 may be formed by a chemical vapor deposition process (e.g., a low pressure chemical vapor deposition process, or a plasma enhanced chemical vapor deposition process), a physical vapor deposition process (e.g., a vacuum evaporation process, or a sputtering process), other applicable processes, or a combination thereof.

Hard mask layers 122 are formed over the dummy gate structure 116, as shown in FIG. 1D in accordance with some embodiments. The hard mask layers 122 may include multiple layers, such as an oxide layer 124 and a nitride layer 126. The oxide layer 124 may include silicon oxide, and the nitride layer 126 may include silicon nitride.

The formation of the dummy gate structure 116 may include conformally forming a dielectric material as the dummy gate dielectric layer 118. Afterwards, a conductive material may be formed over the dielectric material as the dummy gate electrode layers 120, and the bi-layered hard mask layers 122, including the oxide layer 124 and the nitride layer 126, may be formed over the conductive material. Next, the dielectric material and the conductive material may be patterned and etched through the bi-layered hard mask layers 122 to form the dummy gate structure 116, as shown in FIG. 1D in accordance with some embodiments. The dummy gate dielectric layer 118 and the dummy gate electrode layer 120 may be etched by a dry etching process. After the etching process, the first semiconductor material layers 106 and the second semiconductor material layers 108 may be exposed on opposite sides of the dummy gate structure 116.

Next, a conformal dielectric layer is formed over the substrate 102 and the dummy gate structure 116, and then an etching process is performed. A pair of spacer layers 128 is formed over opposite sidewalls of the dummy gate structure 116, and a source/drain opening is formed beside the dummy gate structure 116, as shown in FIG. 1E in accordance with some embodiments.

The spacer layers 128 may be multi-layer structures formed by different materials with different etching selectivity. The spacer layers 128 may be made of silicon oxide, silicon nitride, silicon oxynitride, and/or dielectric materials. The spacer layers 128 may be formed by a chemical vapor deposition (CVD) process, a spin-on-glass process, or another applicable process.

After the spacer layers 128 are formed, the first semiconductor material layers 106 and the second semiconductor material layers 108 of the fin structure 110 not covered by the dummy gate structure 116 and the spacer layers 128 are etched to form the trenches beside the dummy gate structure 116, as shown in FIG. 1F in accordance with some embodiments.

The fin structures 104 may be recessed by performing a number of etching processes. That is, the first semiconductor material layers 106 and the second semiconductor material layers 108 of the fin structures 104 may be etched in different etching processes. The etching process may be a dry etching process or a wet etching process. The fin structures 104 may be etched by a dry etching process.

Next, the first semiconductor material layers 106 are laterally etched from the source/drain opening to form recesses, as shown in FIG. 1G in accordance with some embodiments. The outer portions of the first semiconductor material layers 106 may be removed, and the inner portions of the first semiconductor material layers 106 under the dummy gate structure 116 and the spacer layers 128 may remain. After the lateral etching process, the sidewalls of the etched first semiconductor material layers 106 may be not aligned with the sidewalls of the second semiconductor material layers 108.

The lateral etching of the first semiconductor material layers 106 may be a dry etching process, a wet etching process, or a combination thereof. In some embodiments, the first semiconductor material layers 106 are Ge or SiGe and the second semiconductor material layers 108 are Si, and the first semiconductor material layers 106 are selectively etched to form the recesses by using a wet etchant such as, but not limited to, ammonium hydroxide ($NH_4OH$), tetramethylammonium hydroxide (TMAH), ethylenediamine pyrocatechol (EDP), or potassium hydroxide (KOH) solutions, or the like.

Next, an inner spacer 134 is formed in the recess, as shown in FIG. 1H in accordance with some embodiments. The inner spacer 134 may provide a barrier between subsequently formed source/drain epitaxial structures and gate structure. The inner spacer 134 may be made of dielectric material such as silicon oxide ($SiO_2$), silicon nitride (SiN), silicon carbide (SiC), silicon oxynitride (SiON), silicon carbon nitride (SiCN), silicon oxide carbonitride (SiOCN), or a combination thereof. The inner spacer 134 may be formed using a deposition process. The deposition process may include a CVD process (such as LPCVD, PECVD, SACVD, or FCVD), an ALD process, another applicable method, or a combination thereof.

Next, a source/drain epitaxial structure 140 is formed in the source/drain opening, as shown in FIG. 1I in accordance with some embodiments. The source/drain epitaxial structure 140 may be formed over opposite sides of the dummy gate structure 116. Source/drain epitaxial structure 140 may refer to a source or a drain, individually or collectively dependent upon the context.

A strained material may be grown in the source/drain opening using an epitaxial (epi) process to form the source/drain epitaxial structure 140. The lattice constant of the strained material may be different from the lattice constant of the substrate 102. The source/drain epitaxial structure 140 may include SiGeB, SiP, SiAs, SiGe, other applicable materials, or a combination thereof. The source/drain epitaxial structure 140 may be formed by an epitaxial growth step, such as metalorganic chemical vapor deposition (MOCVD), metalorganic vapor phase epitaxy (MOVPE), plasma-enhanced chemical vapor deposition (PECVD), remote plasma-enhanced chemical vapor deposition (RP-CVD), molecular beam epitaxy (MBE), hydride vapor phase epitaxy (HYPE), liquid phase epitaxy (LPE), chloride vapor phase epitaxy (Cl-VPE), or any other suitable method.

The source/drain epitaxial structure 140 may be in-situ doped during the epitaxial growth process. For example, the source/drain epitaxial structures 140 may be the epitaxially grown SiGe doped with boron (B). For example, the source/drain epitaxial structure 140 may be the epitaxially grown Si doped with carbon to form silicon:carbon (Si:C) source/drain features, phosphorous to form silicon:phosphor (Si:P) source/drain features, or both carbon and phosphorous to form silicon carbon phosphor (SiCP) source/drain features. The source/drain epitaxial structure 140 may be doped in one or more implantation processes after the epitaxial growth process.

Next, a contact etch stop layer 142 is formed over the source/drain epitaxial structure 140, as shown in FIG. 1J in accordance with some embodiments. More specifically, the contact etch stop layer 142 covers the sidewalls of the spacer layers 128 and the source/drain epitaxial structures 140 in accordance with some embodiments.

The contact etch stop layer 142 may be made of a dielectric material such as silicon nitride, silicon oxide, silicon oxynitride (SiON), other applicable materials, or a combination thereof. The contact etch stop layer 142 may be formed by a chemical vapor deposition process (e.g., a plasma enhanced chemical vapor deposition (PECVD) process, or a metalorganic chemical vapor deposition (MOCVD) process), an atomic layer deposition (ALD) process (e.g., a plasma enhanced atomic layer deposition (PEALD) process), a physical vapor deposition (PVD) process (e.g., a vacuum evaporation process, or a sputtering process), other applicable processes, or a combination thereof.

After the contact etch stop layer 142 is formed, an inter-layer dielectric (ILD) structure 144 is formed over the contact etch stop layer 142, as shown in FIG. 1J in accordance with some embodiments. The ILD structure 144 may include multilayers made of multiple dielectric materials, such as silicon oxide ($SiO_x$, where x may be a positive integer), silicon oxycarbide ($SiCO_y$, where y may be a positive integer), silicon oxycarbonitride ($SiNCO_z$, where z may be a positive integer), silicon nitride, silicon oxynitride, phosphosilicate glass (PSG), borophosphosilicate glass (BPSG), low-k dielectric material, or another applicable dielectric material. Examples of low-k dielectric materials include, but are not limited to, fluorinated silica glass (FSG), carbon doped silicon oxide, amorphous fluorinated carbon, parylene, bis-benzocyclobutenes (BCB), or polyimide. The ILD structure 144 may be formed by chemical vapor deposition (CVD), physical vapor deposition (PVD), atomic layer deposition (ALD), spin-on coating, or another applicable process.

Afterwards, a planarizing process or an etch-back process is performed on the ILD structure 144 until the top surface of the dummy gate structure 116 is exposed, as shown in FIG. 1J in accordance with some embodiments. After the planarizing process, the top surface of the dummy gate structure 116 may be substantially level with the top surfaces of the spacer layers 128 and the ILD structure 144. The hard mask layers 122 including the oxide layer 124 and the nitride layer 126 may be removed during the planarizing process. The planarizing process may include a grinding process, a chemical mechanical polishing (CMP) process, an etching process, other applicable processes, or a combination thereof.

Next, the dummy gate structure 116 is removed, as shown in FIG. 1K in accordance with some embodiments. Therefore, a trench 146 is formed between the spacer layers 128 over the fin structure 110 and the first semiconductor material layers 106 may be exposed from the trench 146.

The dummy gate structure 116 may be removed by a dry etching process or a wet etching process. The removal process may include one or more etching processes. For example, when the dummy gate electrode layers 120 are polysilicon, a wet etchant such as a tetramethylammonium hydroxide (TMAH) solution may be used to selectively remove the dummy gate electrode layers 120. Afterwards, the dummy gate dielectric layer 118 may be removed using a plasma dry etching, a dry chemical etching, and/or a wet etching.

Next, the first semiconductor material layers 106 are removed and gaps are formed between the first semiconductor material layers 106, as shown in FIG. 1K in accordance with some embodiments. More specifically, the second semiconductor material layers 108 exposed by the gaps form nanostructures 108, and the nanostructures 108 are configured to function as channel regions in the resulting semiconductor devices in accordance with some embodiments.

The first semiconductor material layers 106 may be removed by performing one or more etching processes. The etching process may include a selective wet etching process, such as APM (e.g., ammonia hydroxide-hydrogen peroxide-water mixture) etching process. The wet etching process uses etchants such as ammonium hydroxide ($NH_4OH$), TMAH, ethylenediamine pyrocatechol (EDP), and/or potassium hydroxide (KOH) solutions.

Next, a gate structures 148 are formed surrounding the nanostructures 108 and over the nanostructures 108. Gate structures 148 are formed surrounding the nanostructures 108 to form gate-all-around (GAA) transistor structures, as shown in FIG. 1L in accordance with some embodiments. Therefore, the gate control ability may be enhanced.

In some embodiments as shown in FIG. 1L, the gate structures 148 are multi-layered structures. Each of the gate structures 148 may include an interfacial layer, a gate dielectric layer 150, a work function layer 152, and a gate electrode layer, as shown in FIG. 1L in accordance with some embodiments. For the purpose of brevity, only the gate dielectric layer 150 and the work function layer 152 are shown in FIG. 1L.

The interfacial layer may be formed around the nanostructures 108. The interfacial layer may be made of silicon oxide, and the interfacial layer may be formed by thermal oxidation.

The gate dielectric layer 150 is formed over the interfacial layer, so that the nanostructures 108 are surrounded (e.g. wrapped) by the gate dielectric layer 150. In addition, the gate dielectric layer 150 also covers the sidewalls of the spacer layers 128 and the inner spacers 134 in accordance with some embodiments. The gate dielectric layer 150 may be made of one or more layers of dielectric materials, such as $HfO_2$, HfSiO, HfSiON, HfTaO, HfTiO, HfZrO, zirconium oxide, aluminum oxide, titanium oxide, hafnium dioxide-alumina ($HfO_2$—$Al2O_3$) alloy, other applicable high-k dielectric materials, or a combination thereof. The gate dielectric layer 150 may be formed using CVD, ALD, other applicable methods, or a combination thereof.

The work function layer 152 may be conformally formed surrounding the nanostructures 108. The work function layer 152 may be also formed over the nanostructures 108. The work function layer 152 may be multi-layer structures.

The work function layer 152 may be made of metal materials. The metal materials of the work function layer 152 may include N-work-function metal. The N-work-function metal may include tungsten (W), copper (Cu), titanium (Ti), silver (Ag), aluminum (Al), titanium aluminum alloy (TiAl), titanium aluminum nitride (TiAlN), tantalum carbide (TaC), tantalum carbon nitride (TaCN), tantalum silicon nitride (TaSiN), manganese (Mn), zirconium (Zr), or a combination thereof. The work function layer 152 may include P-work-function metal. The P-work-function metal may include titanium nitride (TiN), tungsten nitride (WN), tantalum nitride (TaN), ruthenium (Ru) or a combination thereof. The work function layer 152 may be formed by using CVD, ALD, another applicable method, or a combination thereof.

The gate electrode layer may be formed over the work function layer 152. The gate electrode layer may be made of one or more layers of conductive material, such as aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, another suitable material, or a combination thereof. The gate electrode layer may be formed using CVD, ALD, electroplating, another applicable method, or a combination thereof. After the gate electrode layer is formed, a planarization process such as CMP or an etch-back process may be performed.

Next, a source/drain opening is formed in the ILD structure 144 to expose the source/drain epitaxial structure 140, and a silicide layer 161 may be formed over the source/drain epitaxial structure 140. The silicide layer 161 may reduce the contact resistance between the source/drain epitaxial structure 140 and the subsequently formed source/drain contact structure over the source/drain epitaxial structure 140. The silicide layer 161 may be made of titanium silicide (TiSi$_2$), nickel silicide (NiSi), cobalt silicide (CoSi), or other suitable low-resistance materials.

The silicide layer 161 may be formed over the source/drain epitaxial structure 140 by forming a metal layer over the source/drain epitaxial structure 140 first. The metal layer may react with the source/drain epitaxial structure 140 in an annealing process and a silicide layer 161 may be produced. Afterwards, the unreacted metal layer may be removed in an etching process and the silicide layer 161 may be left.

Next, a barrier layer (not shown) may be conformally formed over the bottom surface and the sidewalls of the source/drain opening. Afterwards, the barrier layer may be etched back. The barrier layer remains over the bottom surface of the source/drain opening. The barrier layer may be formed before filling the conductive material in the source/drain opening to prevent the conductive material from diffusing out. The barrier layer may also serve as an adhesive or glue layer. The material of the barrier layer may be tantalum, titanium, titanium nitride, other applicable materials, or a combination thereof. The barrier layer may be formed by depositing the barrier layer materials by a physical vapor deposition process (PVD) (e.g., evaporation or sputtering), an atomic layer deposition process (ALD), an electroplating process, other applicable processes, or a combination thereof.

Afterwards, a source/drain contact structure 162 is formed into the source/drain opening over the source/drain epitaxial structure 140, as shown in FIG. 1M in accordance with some embodiments. The source/drain contact structure 162 may be partially land or fully land over the source/drain epitaxial structure 140.

The source/drain contact structure 162 may be made of aluminum (Al), copper (Cu), tungsten (W), titanium (Ti), tantalum (Ta), titanium nitride (TiN), cobalt, tantalum nitride (TaN), nickel silicide (NiS), cobalt silicide (CoSi), copper silicide, tantalum carbide (TaC), tantalum silicide nitride (TaSiN), tantalum carbide nitride (TaCN), titanium aluminide (TiAl), titanium aluminum nitride (TiAlN), other applicable conductive materials, or a combination thereof.

The source/drain contact structure 162 may be formed by a chemical vapor deposition process (CVD), a physical vapor deposition process (PVD), (e.g., evaporation or sputter), an atomic layer deposition process (ALD), a plasma enhanced CVD (PECVD), a plasma enhanced physical vapor deposition (PEPVD), an electroplating process, another suitable process, or a combination thereof to deposit the conductive materials of the source/drain contact structure 162, and then a planarization process such as a chemical mechanical polishing (CMP) process or an etch back process is optionally performed to remove excess conductive materials. After the planarization process, the top surface of the source/drain contact structure 162 may be level with the top surfaces of the ILD structure 144 and the spacer layers 128.

Next, after the front side S/D contact structure 162 are formed, a front end structure 164 is formed over the gate structures 148, the ILD layer 144, and the front side S/D contact structure 162, as shown in FIG. 1M in accordance with some embodiments. The front end structure 164 may include an etch stop layer and various features (not shown), such as a multilayer interconnect structure (such as contacts to gate, vias, lines, inter metal dielectric layers, passivation layers, etc.) formed thereon.

Next, as shown in FIG. 1N in accordance with some embodiments, after the front end structure 164 is formed, a carrier substrate (not shown) is attached to the front end structure 164, and then the substrate 102 is flipped. Afterwards, a planarization is performed on the back side of the substrate 102. More specifically, a planarization is performed on the substrate 102 until the epitaxial sacrificial structures 136 and the CESL 142 are exposed.

The planarization process may be an etching process, a CMP process, a mechanical grinding process, a dry polishing process, or a combination thereof. The front end structure 164 is configured to support the semiconductor structure in subsequent manufacturing process.

It is appreciated that although the structures in FIG. 1N is shown in upside down for better understanding the manufacturing processes, the spatial positions of the elements (e.g. top portions, bottom portions, topmost, bottommost, or the like) are described according to the original positions shown in FIGS. 1A to 1M so they can be in consistence with those described previously for clarity. For example, the front side surface of the S/D epitaxial structure 140 refers to the surface that is in contact with the S/D contact structure 162, and the back side surface of the S/D structures 140 refers to the surface that is in contact with the substrate 102, since the structure shown in FIG. 1N is upside down.

FIGS. 1O-1W show cross-sectional representations of various stages of manufacturing the semiconductor structure 10a after FIG. 1N, in accordance with some embodiments.

After the substrate 102 is flipped, a hard mask layer 172 may be formed over the back side of the substrate 102. The hard mask layer 172 may be made of silicon nitride, silicon carbon nitride (SiCN), or applicable material. The hard mask layer 172 may be formed by a deposition process, such as low-pressure CVD (LPCVD) process, plasma enhanced CVD (PECVD) process, or another deposition process.

Figure 1O:
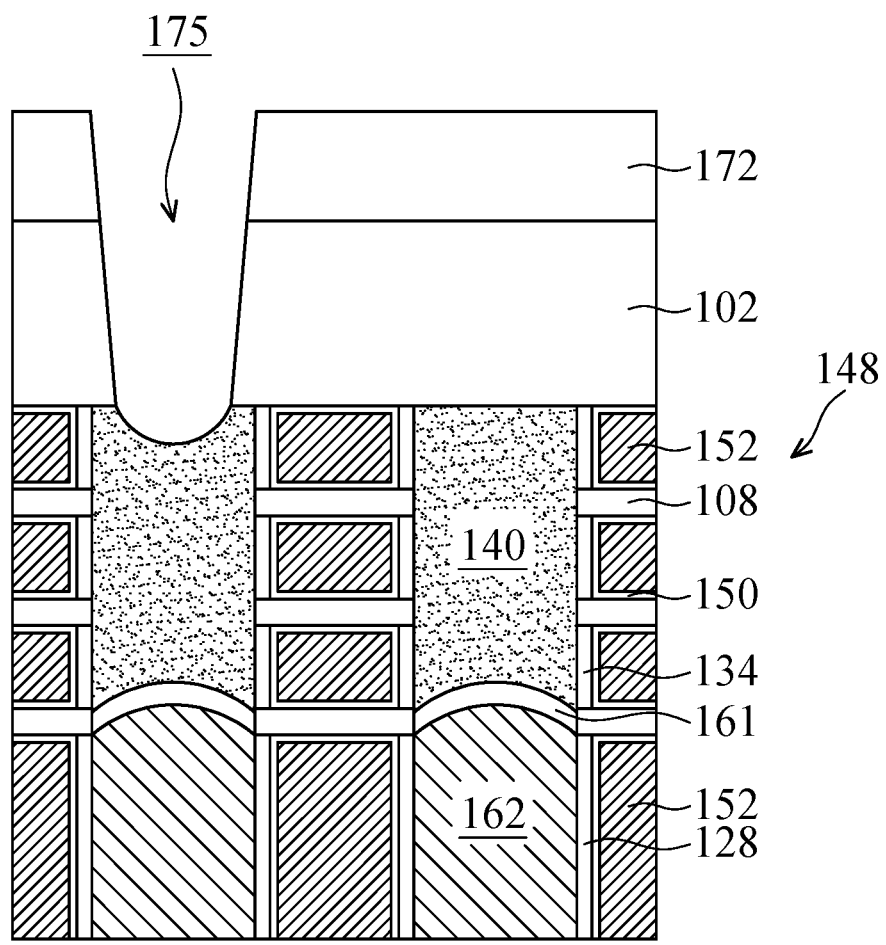

Afterwards, a portion of the hard mask layer 172, the substrate 102, and the source/drain epitaxial structure 140 are removed, and a trench 175 is formed, as shown in FIG. 1O, in accordance with some embodiments. The trench 175 may be formed by a dry etching process or a wet etching process. The source/drain epitaxial structure 140 may have a concave bottom surface after the trench 175 is formed.

Figure 1P:
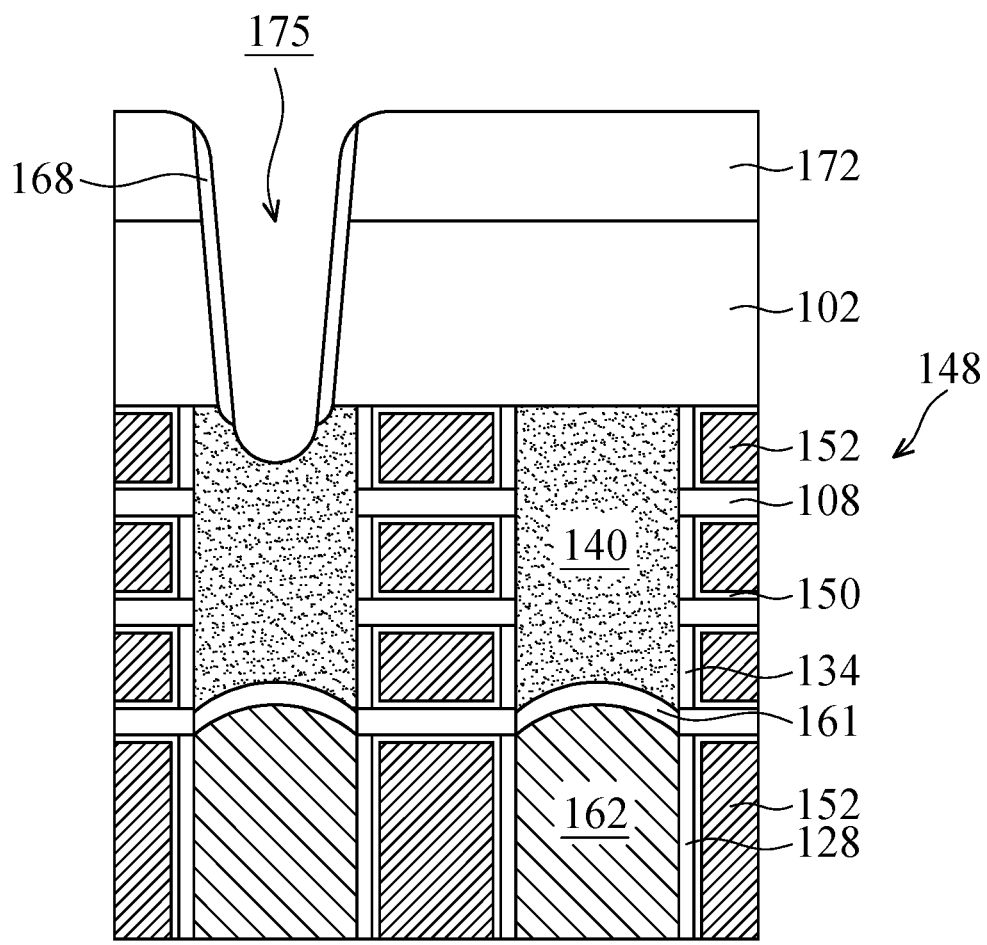

Afterwards, after the trench 175 is formed, a liner layer 168 is formed over the sidewalls of the trench 175, as shown in FIG. 1P in accordance with some embodiments. The liner layer 168 may be made of SiN, SiCN, SiOCN, SiON, other applicable materials, or a combination thereof. In some embodiments, the liner layer 168 is made of SiN.

In some embodiments, the liner layer 168 has a thickness in a range of about 2 nm to about 5 nm. If the liner layer 168 is too thick, the area of subsequently formed conductive material may be too small, and it may be difficult to fill the conductive material in the trench 175. If the liner layer 168 is too thin, the liner layer 168 may not be uniformly formed over the sidewalls of the trench 175.

The liner layer 168 may be conformally formed over sidewalls and bottom surface of the trench 175 and over the top surface of the hard mask layer 172 first, and then the liner layer 168 over the bottom surface of the trench 175 and over the top surface of the hard mask layer 172 may be removed. The liner layer 168 may be formed by a deposition process, such as chemical vapor deposition (CVD), physical vapor deposition, (PVD), atomic layer deposition (ALD), or another applicable process. The liner layer 168 may be removed by a dry etching process. The liner layer 168 may increase the isolation between the subsequently formed conductive material and the gate structure 148.

Next, a conductive material layer is formed in the trench 175 and over the liner layer 168 and the hard mask layer 172 (not shown). The conductive material layer may be formed by a deposition process, such as chemical vapor deposition (CVD), physical vapor deposition, (PVD), atomic layer deposition (ALD), or another applicable process.

Figure 1Q:
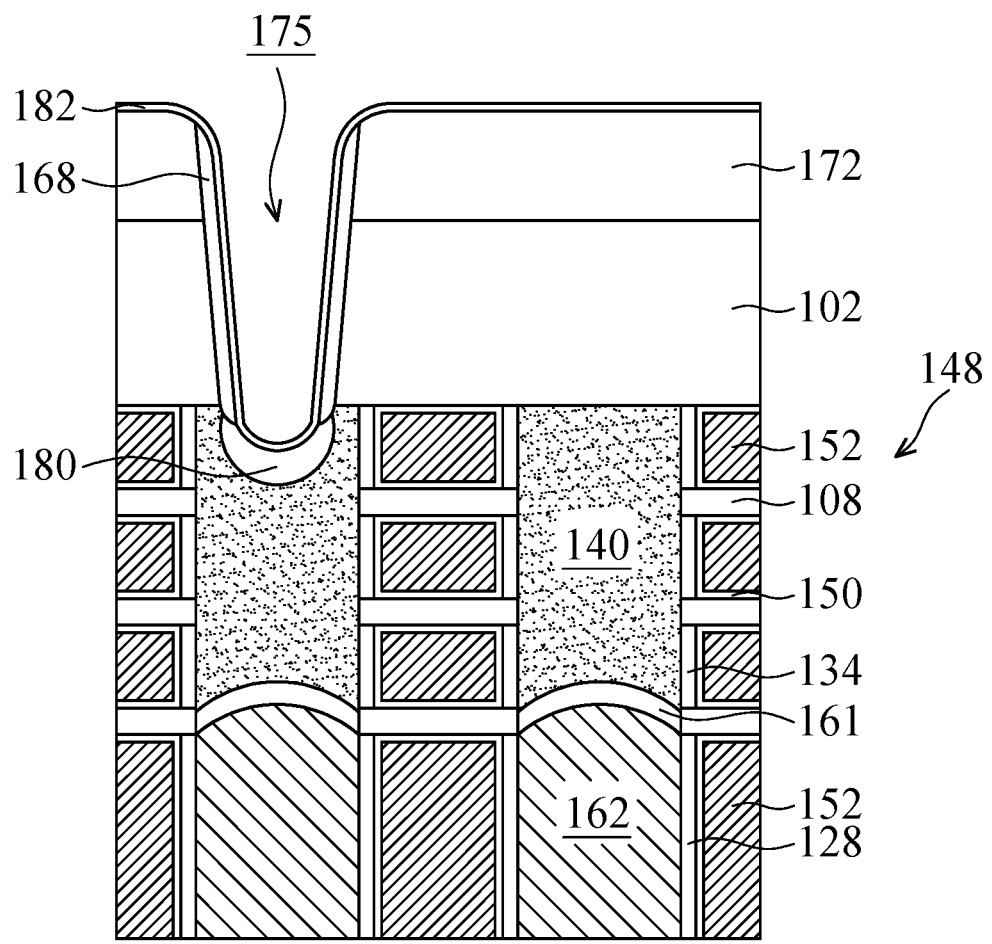

Afterwards, a portion of the conductive material layer is annealed to form a first silicide layer 180 on the exposed S/D structure 140 by an annealing process, as shown in FIG. 1Q in accordance with some embodiments. The first silicide layer 180 is in direct contact with the S/D structure 140 and the liner layer 168. The first silicide layer 180 is formed by annealing the conductive material layer so the conductive material layer reacts with the S/D structures 140 to form the first silicide layer 180. The first silicide layer 180 may be made of NiSi, TiNiSi, CoSi, MoSi, RuSi, TiSi, or the like. In some embodiments, the first silicide layer 180 is made of TiSi.

In some embodiments, the first silicide layer 180 has a thickness in a range of about 0.5 nm to about 10 nm. If the first silicide layer 180 is too thin, the resistance may be worse.

Next, a nitrogen treatment process may be performed on the conductive material layer after the annealing process to form a second silicide layer 182, as shown in FIG. 1Q in accordance with some embodiments. The conductive material layer 180 is nitridized by the nitrogen treatment process.

After the nitrogen treatment process, the conductive material layer becomes the second silicide layer 182. The second silicide layer 182 is made of a nitrogen-containing compound or is made of nitrogen. The second silicide layer 182 may be made of NiSiN, TiNiSiN, CoSiN, MoSiN, RuSiN, TiSiN. In some embodiments, the second silicide layer 182 is made of TiSiN. In some embodiments, the first silicide layer 180 and the second silicide layer 182 include different materials.

Figure 1R:
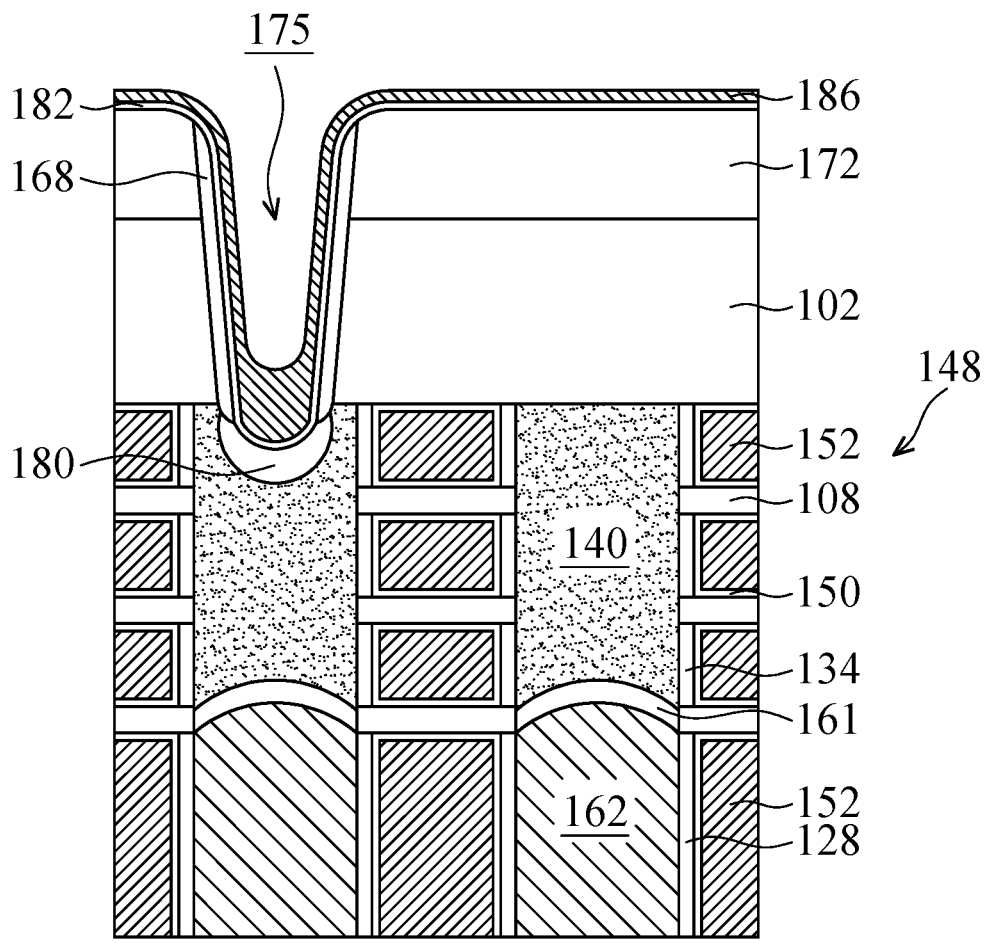

Next, a first conductive layer 186 is formed in the trench 175 over the second silicide layer 182, as shown in FIG. 1R, in accordance with some embodiments. The first conductive layer 186 may be made of Co, Moly, Cu, Ru, W, other applicable materials, or a combination thereof. In some embodiments, the first conductive layer 186 is made of Ru.

The first conductive layer 186 may be formed by a bottom-up deposition process, which is formed form bottom to top. The first silicide layer 180 is located at bottom to help the formation of the first conductive layer 186. By using the bottom-up deposition process, there may be no glue layer formed between the second silicide layer 182 and the first conductive layer 186. The resistance of a glue layer is higher than that of the first conductive layer 186. Therefore, the resistance may be decreased without the glue layer. Therefore, the performance of the semiconductor structure 10a may be improved.

In some embodiments, the first conductive layer 186 is thicker at the bottom of the trench 175 than over the hard mask layer 172.

Figure 1S:
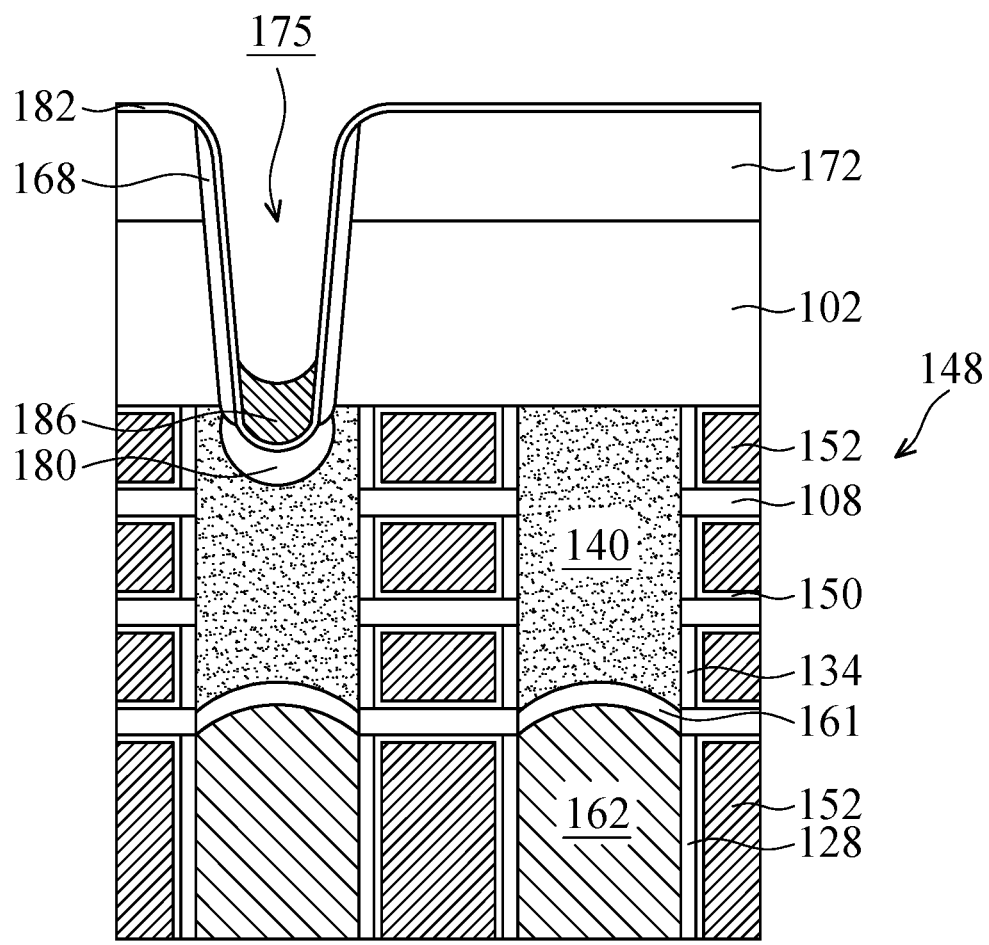

Next, the first conductive layer 186 is etched back, and the first conductive layer 186 over the upper sidewalls of the trench 175 and over the hard mask layer 172 is removed, as shown in FIG. 1s, in accordance with some embodiments. After etching back the first conductive layer 186, the first conductive layer 186 has a dishing shape top surface. The first conductive layer 186 may have a concave top surface.

In some embodiments, the first conductive layer 186 has a height at the bottom of the trench 175 in a range of about 3 nm to about 30 nm. If the first conductive layer 186 is too short, the first silicide layer 180 and the second silicide layer 182 may be damaged in the following etching process. If the first conductive layer 186 is too high, the resistance may be increased.

The first conductive layer 186 may be etched back by chemicals including $Cl_2$ and $O_2$. The ratio of $Cl_2$ and $O_2$ is in a range of about 1:10 to about 10:1. The first conductive layer 186 may be etched back by chemicals including $F_2$. Afterwards, a $H_2$ treatment may be optionally performed.

Figure 1T:
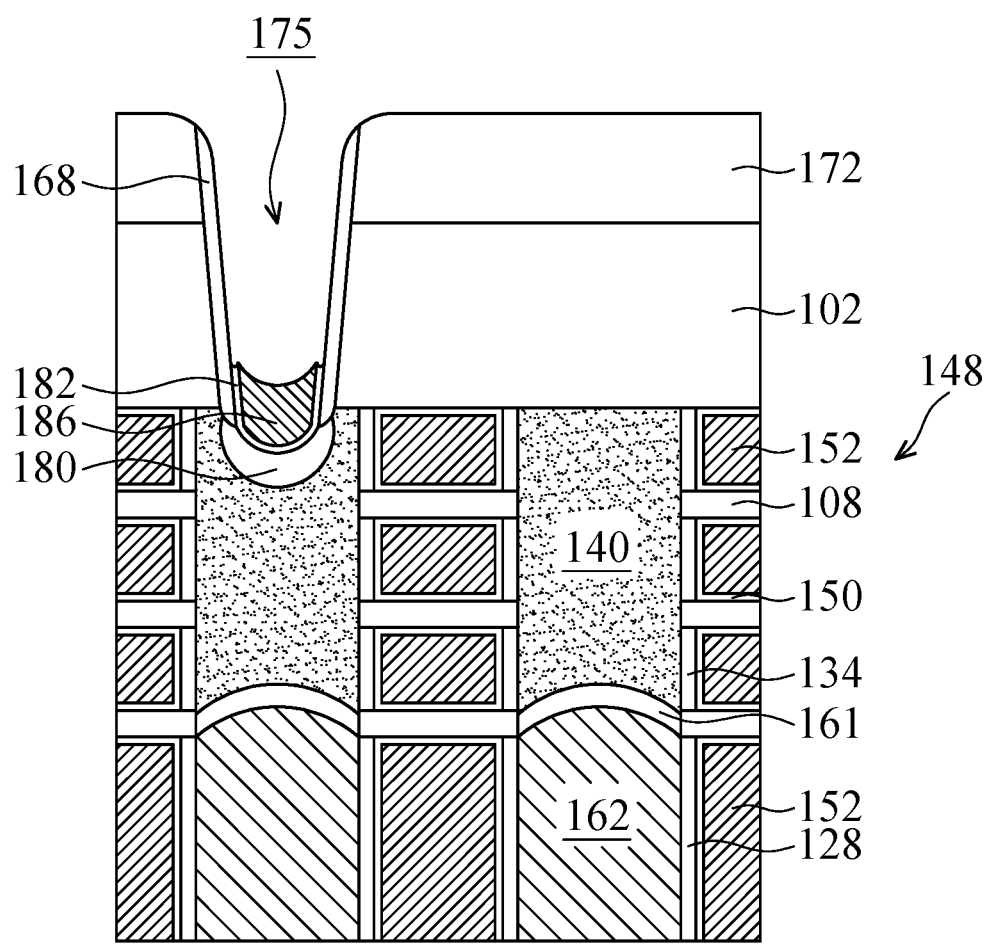

Afterwards, the second silicide layer 182 is etched back, and the upper sidewalls of the liner layer 168 and the top surface of the hard mask layer 172 are exposed, as shown in FIG. 1T in accordance with some embodiments. After etching back the second silicide layer 182, the second silicide layer 182 has a dishing shape top surface. The second silicide layer 182 may have a concave top surface. In some embodiments, the top surface of the first conductive layer 186 is more concave than the top surface of the second silicide layer 182.

In some embodiments, the dishing amount of the second silicide layer 182 is in a range of about 0.5 nm to about 3 nm.

In some embodiments, the second silicide layer 182 surrounds the first conductive layer 186. In some embodiments, second silicide layer 182 is formed at the bottom surface and the sidewalls of the first conductive layer 186.

In some embodiments, the second silicide layer 182 has a thickness in a range of about 0.5 nm to about 10 nm. If the second silicide layer 182 is too thick, the area of the first conductive layer 186 may be too small, and the resistance may be increased. If the second silicide layer 182 is too thin, the resistance may be increased.

The second silicide layer 182 may be etched back by chemicals including DI—$O_3$ water. The second silicide layer 182 may be etched back under a temperature in a range of about 20° C. to about 100° C. The second silicide layer 182 may be etched back for about seconds to about 100 seconds.

The second silicide layer 182 may be also etched back by an O₂ treatment and followed by an HCl wet etching process. The 02 treatment may be performed under a temperature in a range of about 100° C. to about 250° C. with an O₂ flow of about 1000 sccm to about 5000 sccm. The HCl wet etching process may be performed under a temperature in a range of about 20° C. to about 100° C. The HCl wet etching process may be performed for about 30 seconds to about 100 seconds.

In some embodiments, the second silicide layer 182 and the first conductive layer 186 may be removed by different chemicals.

Figure 1U:
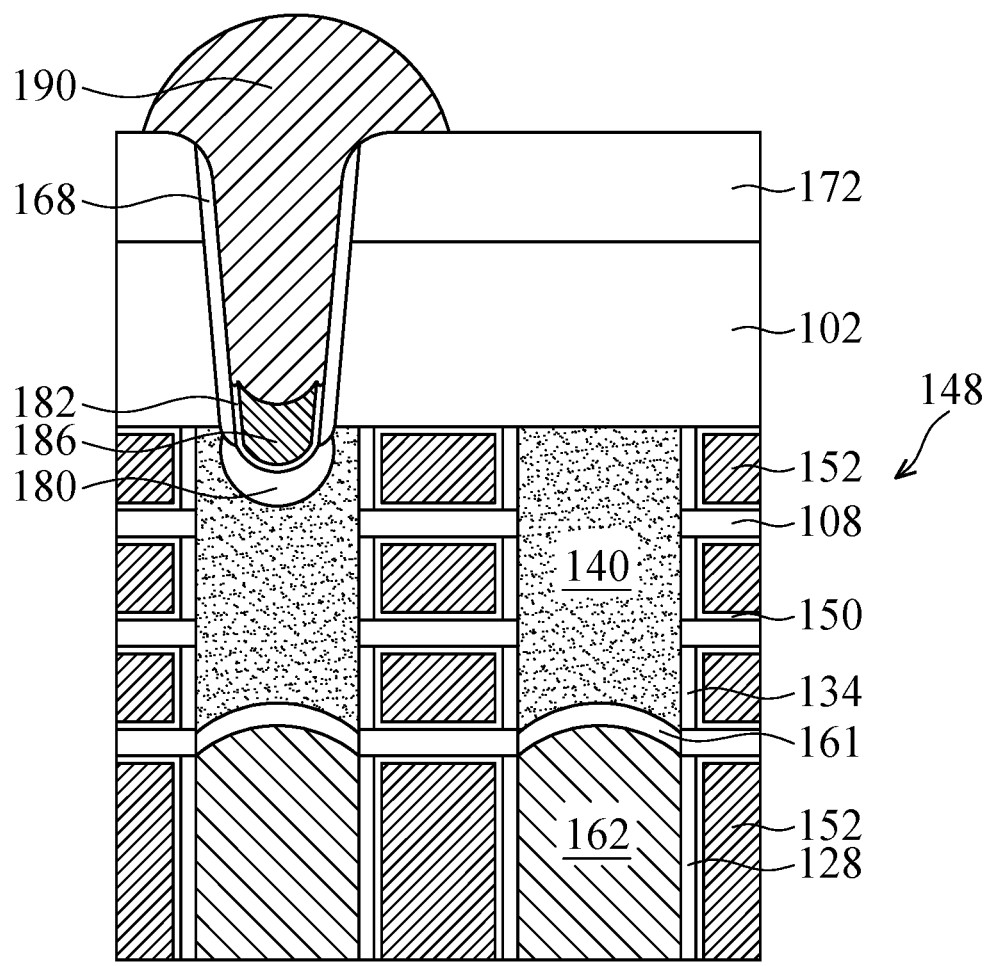

Next, a second conductive layer 190 is formed in the trench 175 over the first conductive layer 186, as shown in FIG. 1U in accordance with some embodiments. The second conductive layer 190 protrudes over the hard mask layer 172. In some embodiments, the second conductive layer 190 has a curved convex upper surface. In some embodiments, the second conductive layer 190 is in direct contact with the liner layer 168.

The second conductive layer 190 may be made of Co, Moly, Cu, Ru, W, other applicable materials, or a combination thereof. In some embodiments, the second conductive layer 190 is made of W. In some embodiments, the first conductive layer 186 and the second conductive layer 190 are made of different materials. In some embodiments, the first conductive layer 186 and the second conductive layer 190 are made of the same material.

In some embodiments, the second conductive layer 190 has a thickness in a range of about 3 nm to about 50 nm. If the second conductive layer 190 is too short, the first silicide layer 180 and the second silicide layer 182 may be damaged in the following etching process. If the second conductive layer 190 is too high, the resistance may be increased.

The second conductive layer 190 may be formed by a bottom-up deposition process, which is formed form bottom to top. By using the bottom-up deposition process, there may be no glue layer formed between the liner layer 168 and the second conductive layer 190. The resistance of a glue layer is higher than that of the second conductive layer 190. Therefore, the resistance may be decreased without the glue layer. Therefore, the performance of the semiconductor structure 10a may be improved by using the bottom-up deposition process.

Figure 1V:
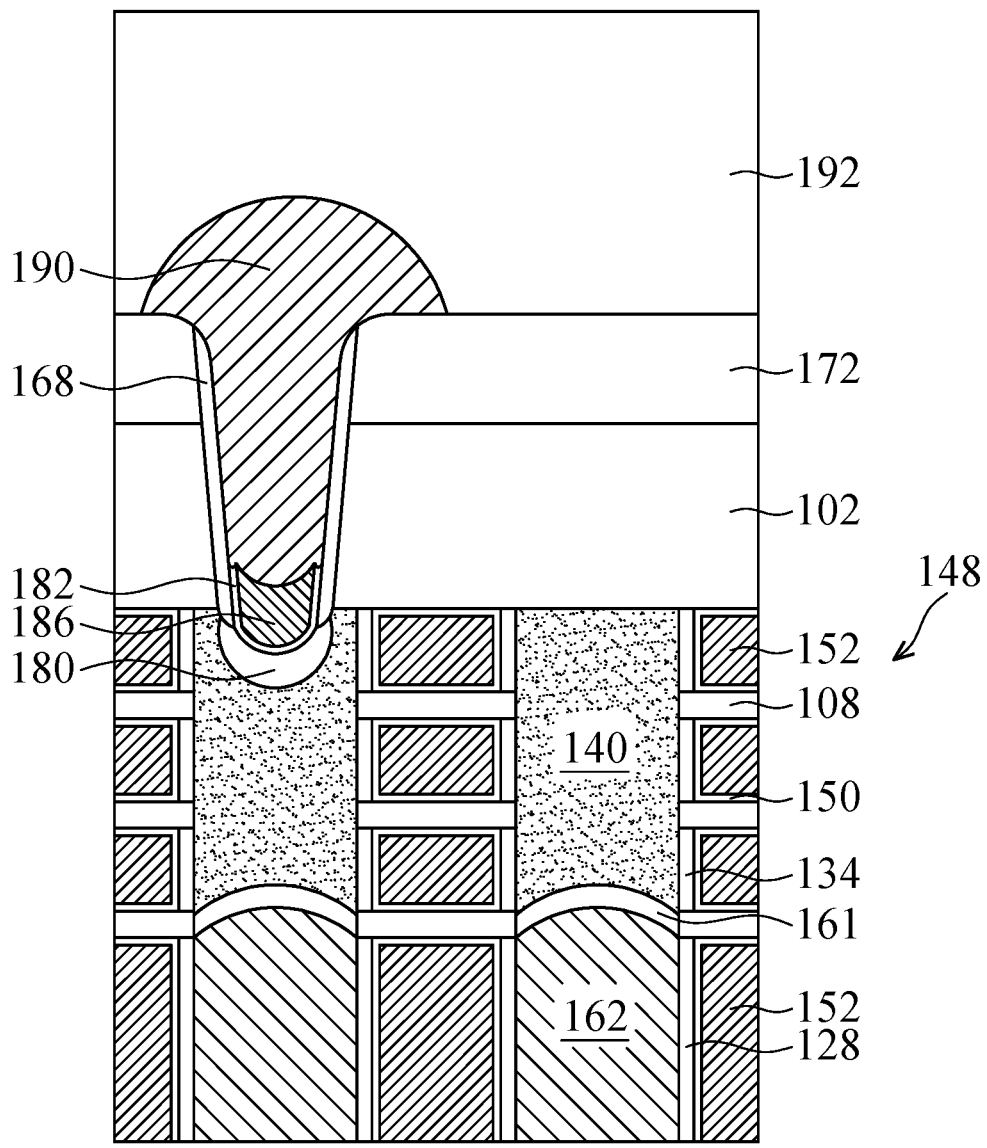

Next, a overburden layer 192 is deposited over the hard mask layer 172 and the second conductive layer 190, as shown in FIG. 1V in accordance with some embodiments. The overburden layer 192 may provide a uniform level for subsequently planarization process. The overburden layer 192 may include SiN, SiO, SiON, SiCN, other applicable materials, or a combination thereof. The overburden layer 192 may be formed by chemical vapor deposition (CVD), physical vapor deposition, (PVD), atomic layer deposition (ALD), or another applicable process.

Figure 1W:
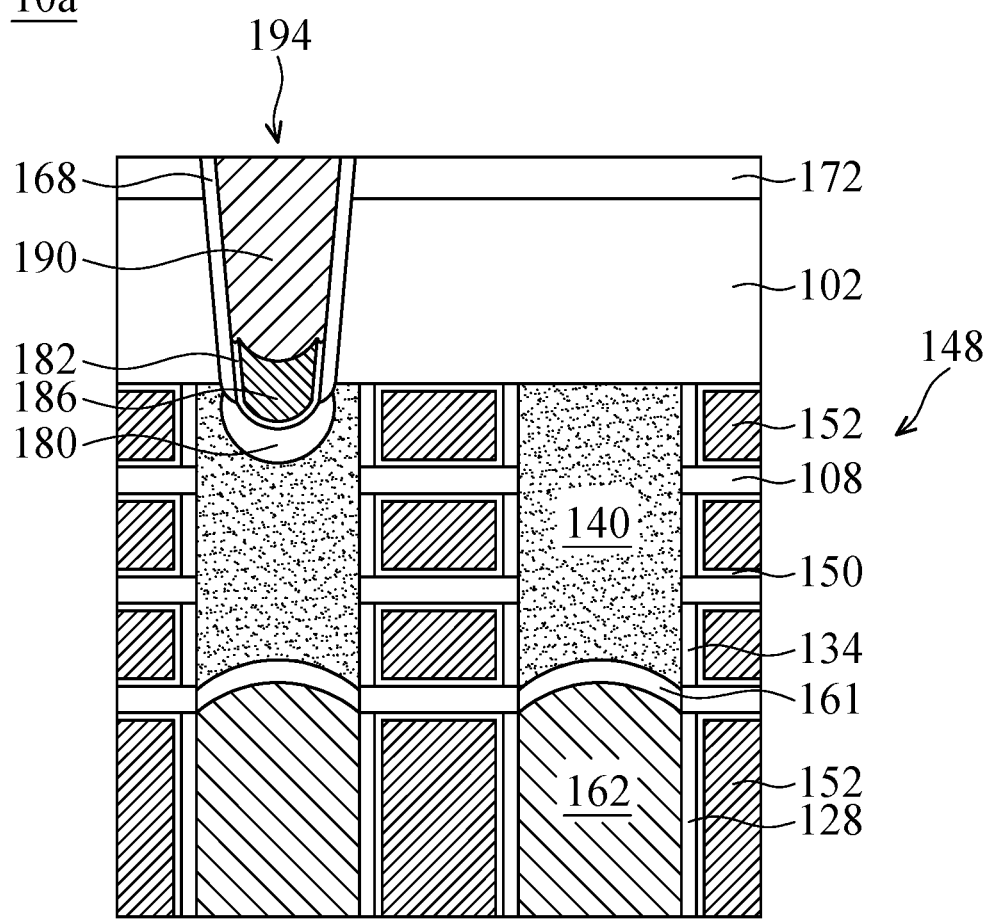

Afterwards, a planarization process may be performed, and the overburden layer 192 and a portion of the hard mask layer 172 may be removed, and a back-side source/drain contact structure 194 is formed, as shown in FIG. 1W in accordance with some embodiments. The planarization process may be an etching process, a CMP process, a mechanical grinding process, a dry polishing process, or a combination thereof. In some embodiments, the liner layer 168 is formed over sidewalls of the back-side source/drain contact structure 194.

Figure 2:
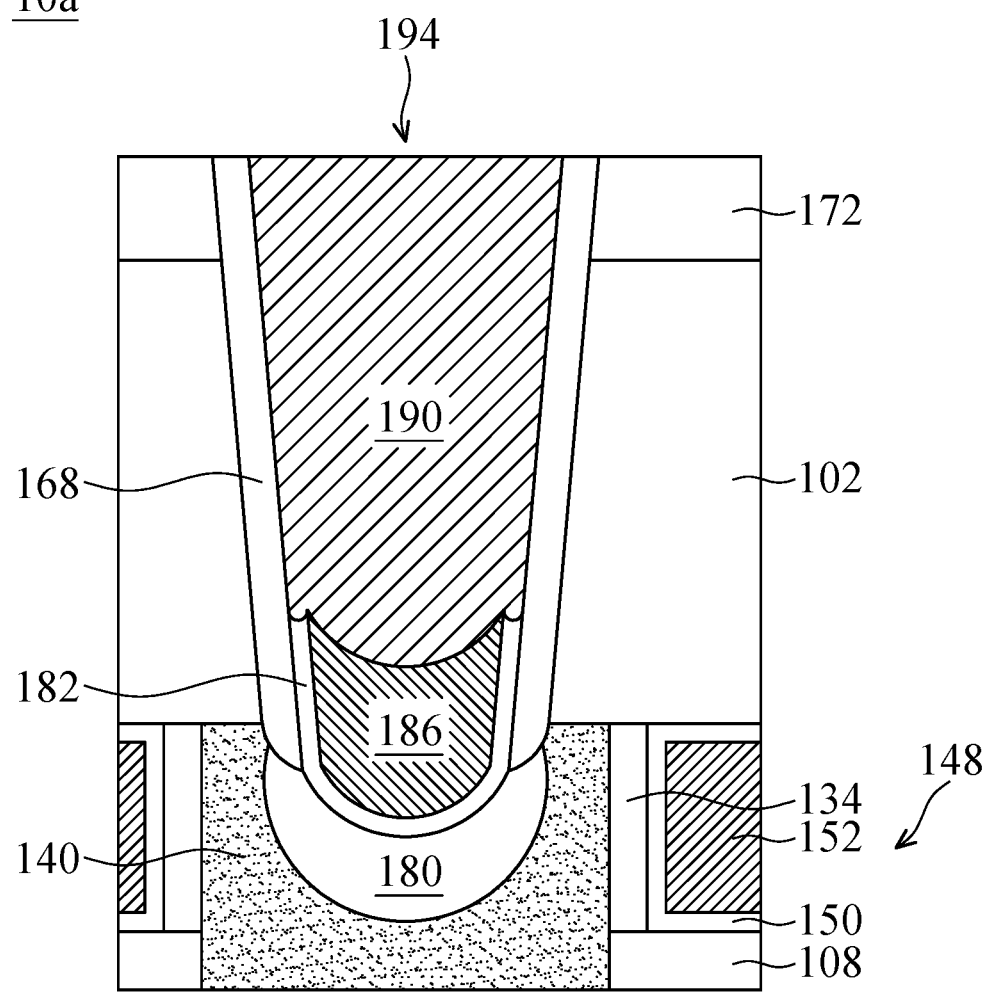
FIG. 2 is an enlarged cross-sectional representation of a semiconductor device structure, in accordance with some embodiments of the disclosure.

FIG. 2 is an enlarged cross-sectional representation of a semiconductor device structure 10a, in accordance with some embodiments of the disclosure. In some embodiments, both the first conductive material 186 and the second silicide layer 182 have concave top surfaces.

By forming the back-side source/drain contact structure 194 by two-step etching back process, the back-side source/drain contact structure 194 may be formed by bottom-up deposition process without void or selective loss. In addition, the first silicide layer 180 may not be damaged, and the contact resistance may be decreased.

Figure 3A:
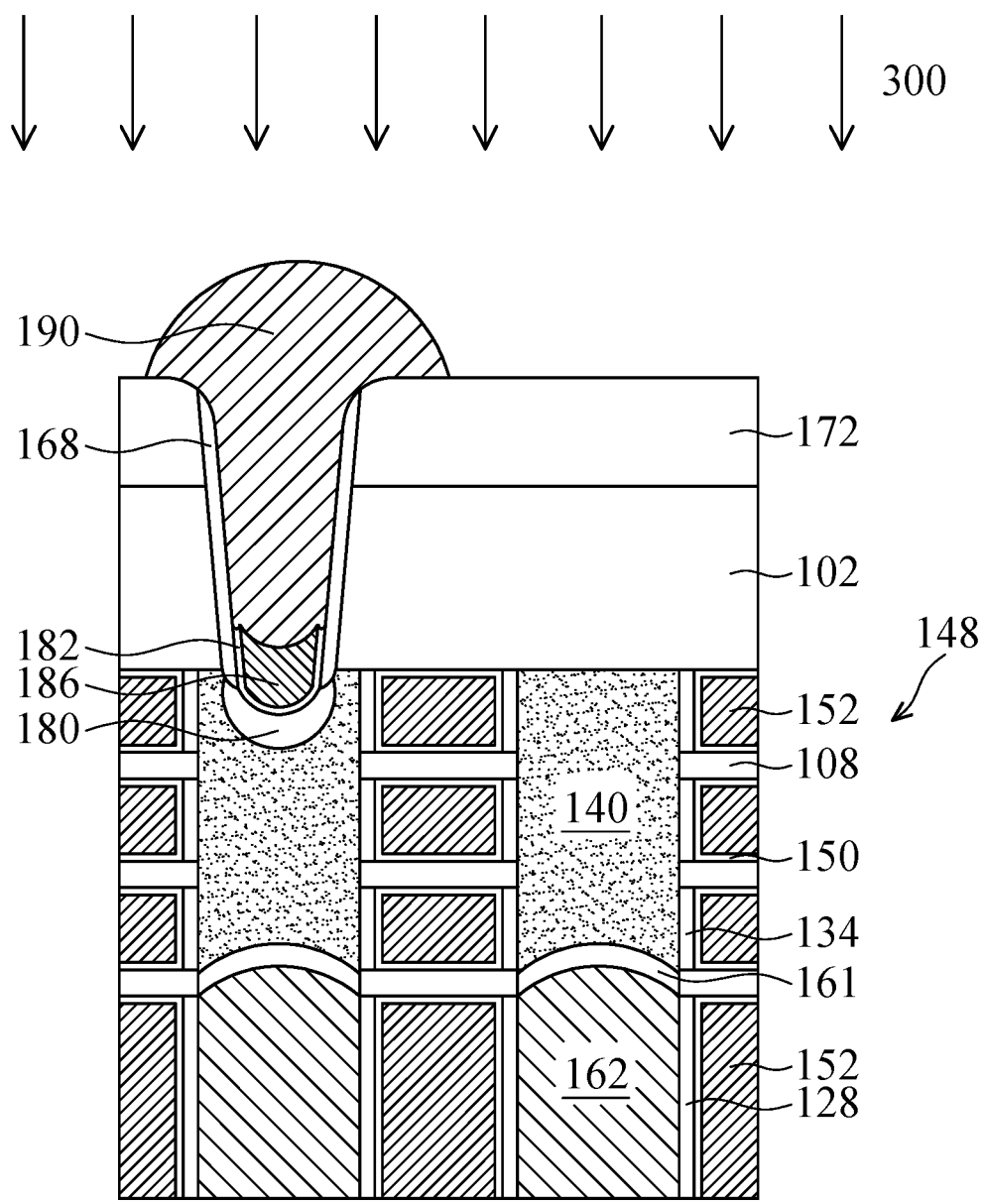
FIGS. 3A-3B are cross-sectional representations of various stages of forming a semiconductor device structure, in accordance with some embodiments of the disclosure.
Figure 3B:
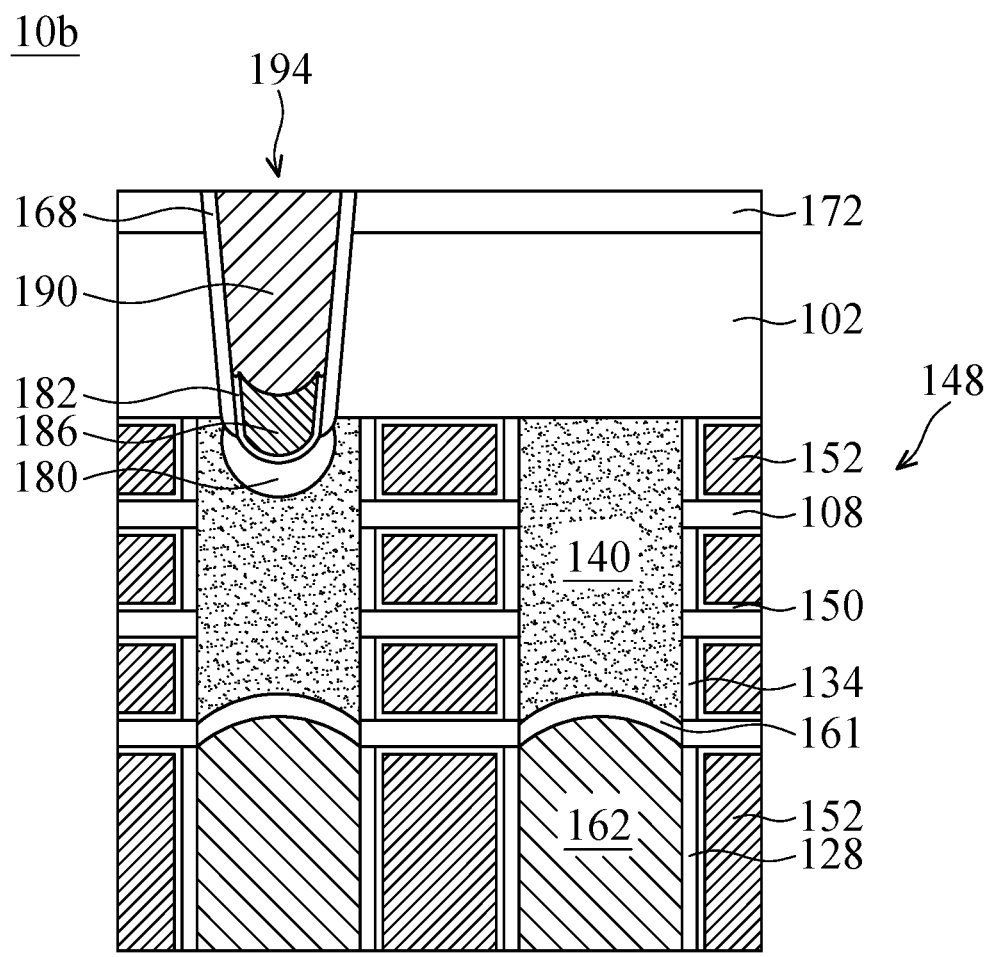

Many variations and/or modifications may be made to the embodiments of the disclosure. FIGS. 3A-3B are perspective representations of various stages of forming a semiconductor device structure 10b, in accordance with some embodiments of the disclosure. Some processes or devices are the same as, or similar to, those described in the embodiments above, and therefore the descriptions of these processes and devices are not repeated herein. The difference from the embodiments described above is that, as shown in FIG. 3A in accordance with some embodiments, an implantation process 300 is performed after forming the second conductive layer 190.

In some embodiments, the implantation process 300 includes using a germanium (Ge)-containing compound. The adhesion between the liner layer 168 and the second conductive layer 190 may be improved by the Ge-containing compound.

In some embodiments, the implantation process 300 is performed by using a fluorine (F)-containing compound or a carbon (C)-containing compound. The dielectric constant may be reduced by the F-containing compound or the C-containing compound. The capacitance and the performance may be further improved.

In some embodiments, the Ge-containing compound is implanted at an energy in a range from about 30 keV to about 50 keV. The Ge-containing compound may be distributed in the substrate 102 and the hard mask layer 172. In some embodiments, the dosage of the Ge-containing compound is from about $1E13(cm^{-3})$ to about $1E16(cm^{-3})$. In some embodiments, the tilt angle of the implantation process 300 is in a range from about 20 degree to about 50 degree.

In some embodiments, the F-containing compound or the C-containing compound are implanted at an energy in a range from about 20 keV to about 40 keV. The F-containing compound or the C-containing compound may be distributed in the hard mask layer 172. In some embodiments, the dosage of the F-containing compound or the C-containing compound is from about $1E13(cm^{-3})$ to about $1E16(cm^{-3})$. In some embodiments, the tilt angle of the implantation process 300 is in a range from about 20 degree to about 50 degree.

Afterwards, an overburden layer 192 is formed and a planarization process is performed to form the back-side source/drain contact structure 194, as shown in FIG. 3B in accordance with some embodiments. After the implantation process 300, the Ge-containing compound may be distributed in the hard mask layer 172, the substrate 102, and the back-side source/drain contact structure 194.

By forming the back-side source/drain contact structure 194 by two-step etching back process, the back-side source/drain contact structure 194 may be formed by bottom-up deposition process without void or selective loss. In addition, the first silicide layer 180 may not be damaged, and the contact resistance may be decreased. An implantation process performed with the Ge-containing compound after depositing the second conductive layer 190 may improve the adhesion between the liner layer 168 and the second conductive layer 190. An implantation process performed with the F-containing compound or C-containing compound after depositing the second conductive layer 190 may lower the capacitance.

Figure 4A:
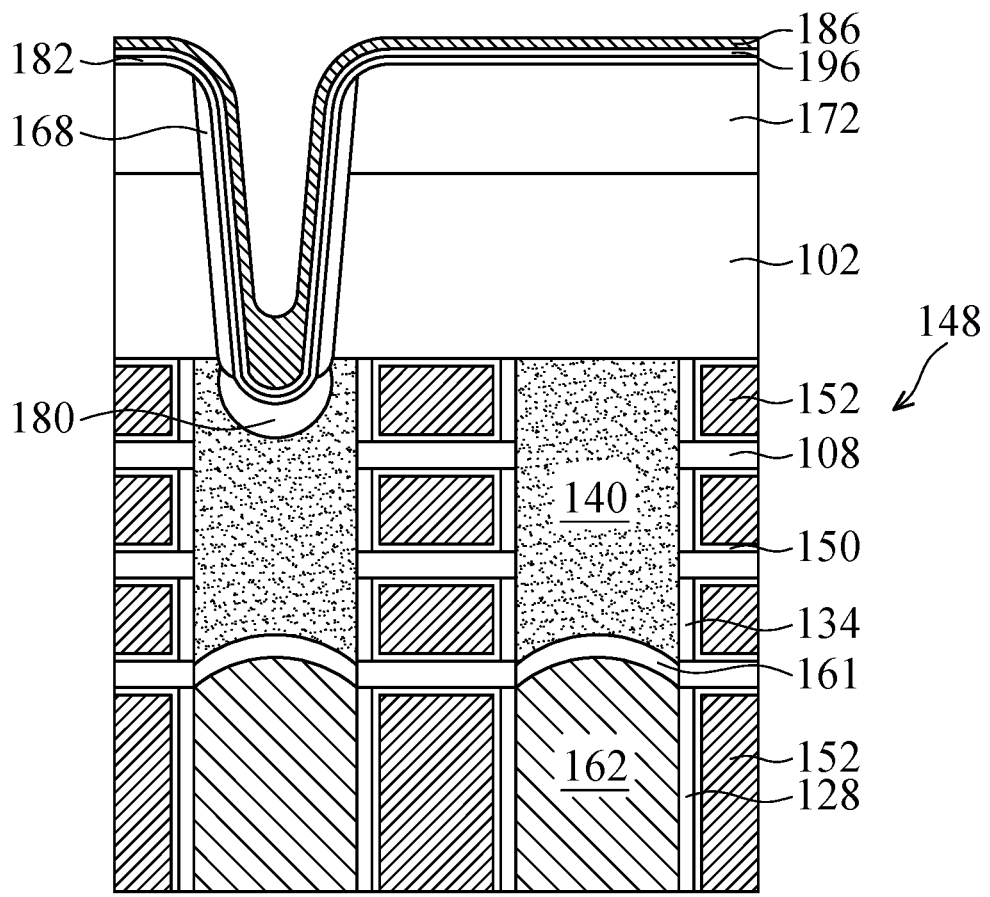
FIGS. 4A-4C are cross-sectional representations of various stages of forming a semiconductor device structure, in accordance with some embodiments of the disclosure.
Figure 4B:
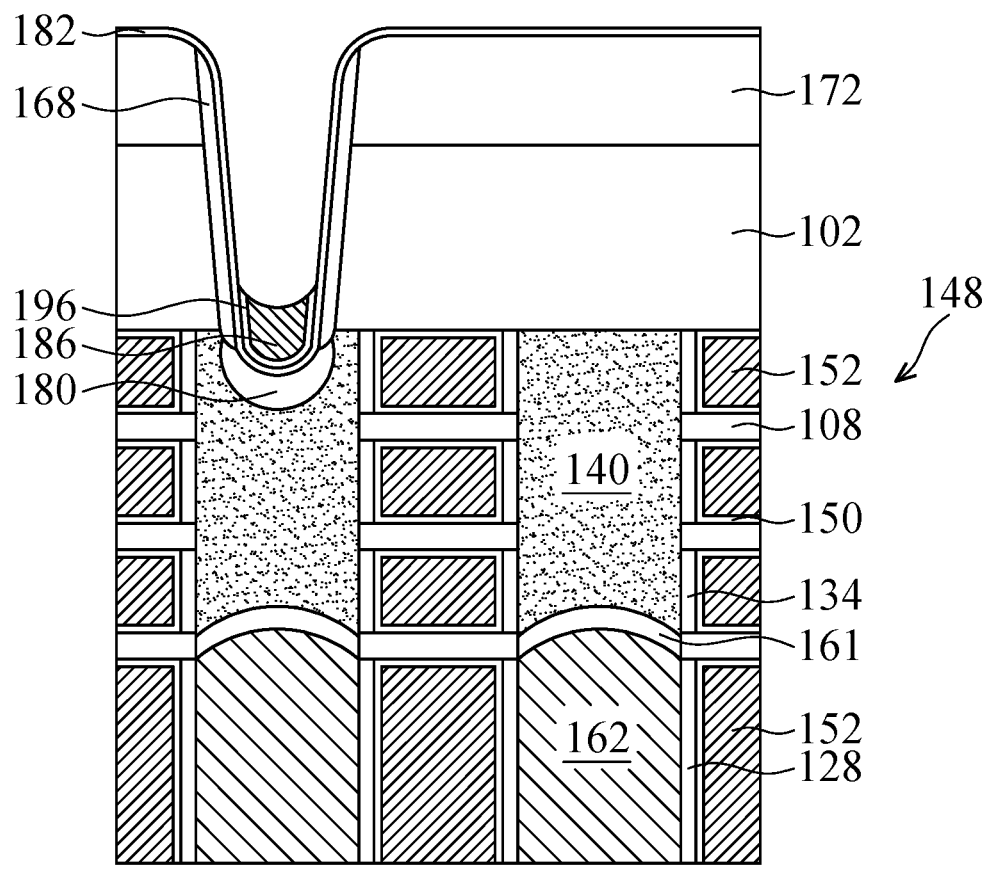

Many variations and/or modifications may be made to the embodiments of the disclosure. FIGS. 4A-4B are perspective representations of various stages of forming a semiconductor device structure 10c, in accordance with some embodiments of the disclosure. Some processes or devices are the same as, or similar to, those described in the embodiments above, and therefore the descriptions of these processes and devices are not repeated herein. The difference from the embodiments described above is that, as shown in FIG. 4A in accordance with some embodiments, a barrier layer 196 is formed before depositing the first conductive layer 186.

In some embodiments, the first conductive layer 186 is formed by CVD such as low-pressure CVD (LPCVD) process, plasma enhanced CVD (PECVD) process, or another deposition process. Therefore, the barrier layer 196 needs to be formed to enhance adhesion between the second silicide layer 182 and the first conductive layer 186. The barrier layer 196 may also prevent the first conductive layer 186 from diffusing out.

Afterwards, the barrier layer 196 is etched back while etching back the first conductive layer 186, as shown in FIG. 4B in accordance with some embodiments. In some embodiments, after the etching back process, the top surface of the barrier layer 196 is higher than the top surface of the first conductive layer 186.

Figure 4C:
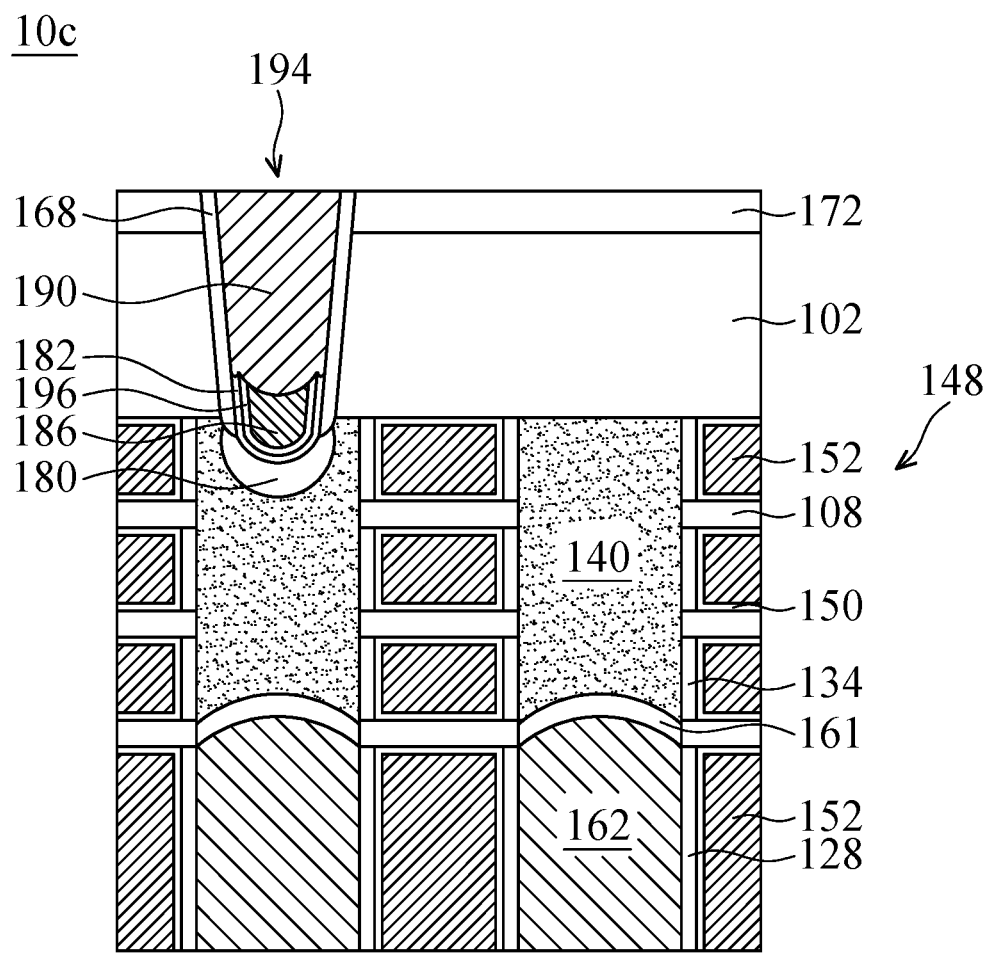

Next, the second silicide layer 182 is etched back, and the top surface of the second silicide layer 182 has a dishing shape, as shown in FIG. 4C in accordance with some embodiments. The processes for etching back the second silicide layer 182 may be the same as, or similar to, those used to etch back the second silicide layer 182 in the previous embodiments. For the purpose of brevity, the descriptions of these processes are not repeated herein.

Afterwards, a second conductive layer 190 is formed over the first conductive layer 186, the barrier layer 196, and the second silicide layer 182, and a planarization process is performed to form the back-side source/drain contact structure 194, as shown in FIG. 4C in accordance with some embodiments.

By forming the back-side source/drain contact structure 194 by two-step etching back process, the back-side source/drain contact structure 194 may be formed by bottom-up deposition process without void or selective loss. In addition, the first silicide layer 180 may not be damaged, and the contact resistance may be decreased. A barrier layer 196 may be formed between the second silicide layer 182 and the first conductive layer 186 while the first conductive layer 186 is formed by a CVD deposition process.

Figure 5:
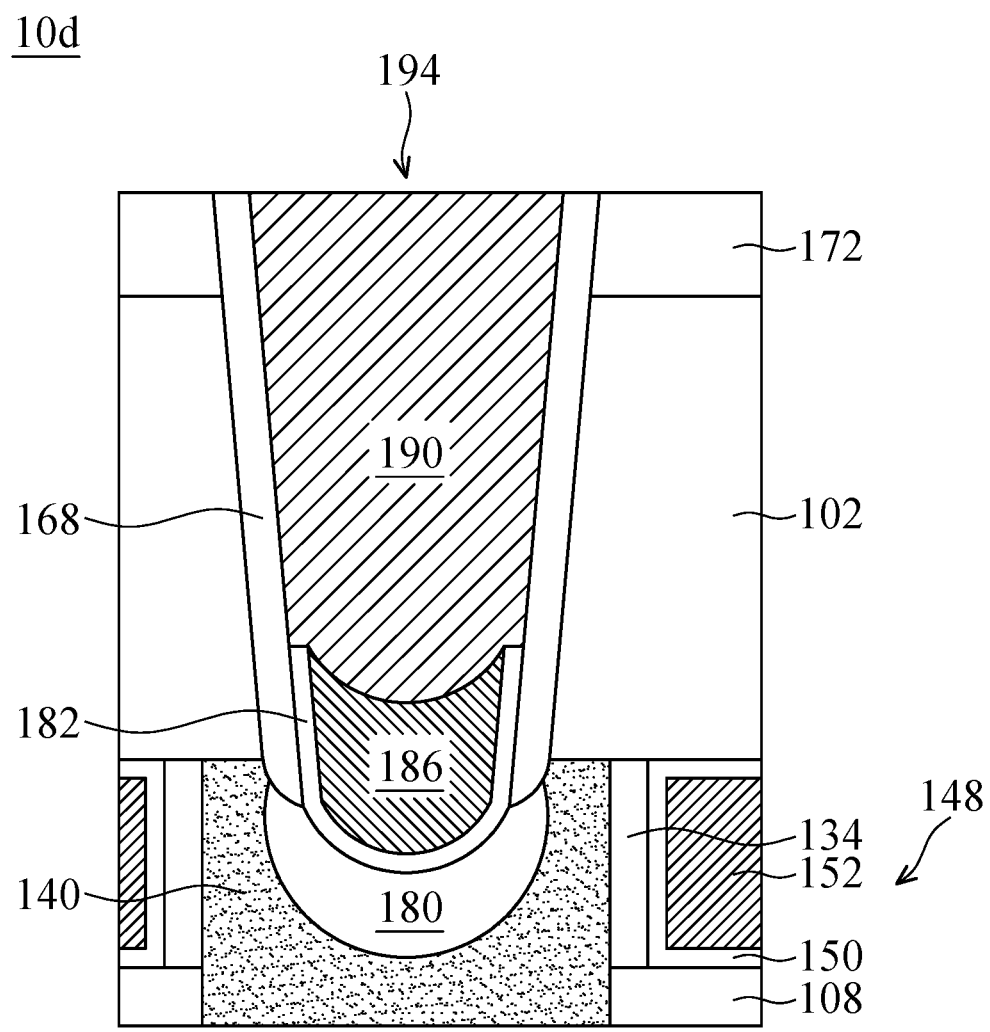
FIG. 5 is an enlarged cross-sectional representation of a semiconductor device structure, in accordance with some embodiments of the disclosure.

Many variations and/or modifications may be made to the embodiments of the disclosure. FIG. 5 is an enlarged cross-sectional representation of a semiconductor device structure 10d, in accordance with some embodiments of the disclosure. Some processes or devices are the same as, or similar to, those described in the embodiments above, and therefore the descriptions of these processes and devices are not repeated herein. The difference from the embodiments described above is that, as shown in FIG. 5 in accordance with some embodiments, the second silicide layer 182 has a flat top surface.

When etching back the second silicide layer 182, if the etching time is shorter, the top surface of the second silicide layer 182 may be flat.

By forming the back-side source/drain contact structure 194 by two-step etching back process, the back-side source/drain contact structure 194 may be formed by bottom-up deposition process without void or selective loss. In addition, the first silicide layer 180 may not be damaged, and the contact resistance may be decreased. The second silicide layer 182 may have a flat top surface by modifying the etching time.

Figure 6:
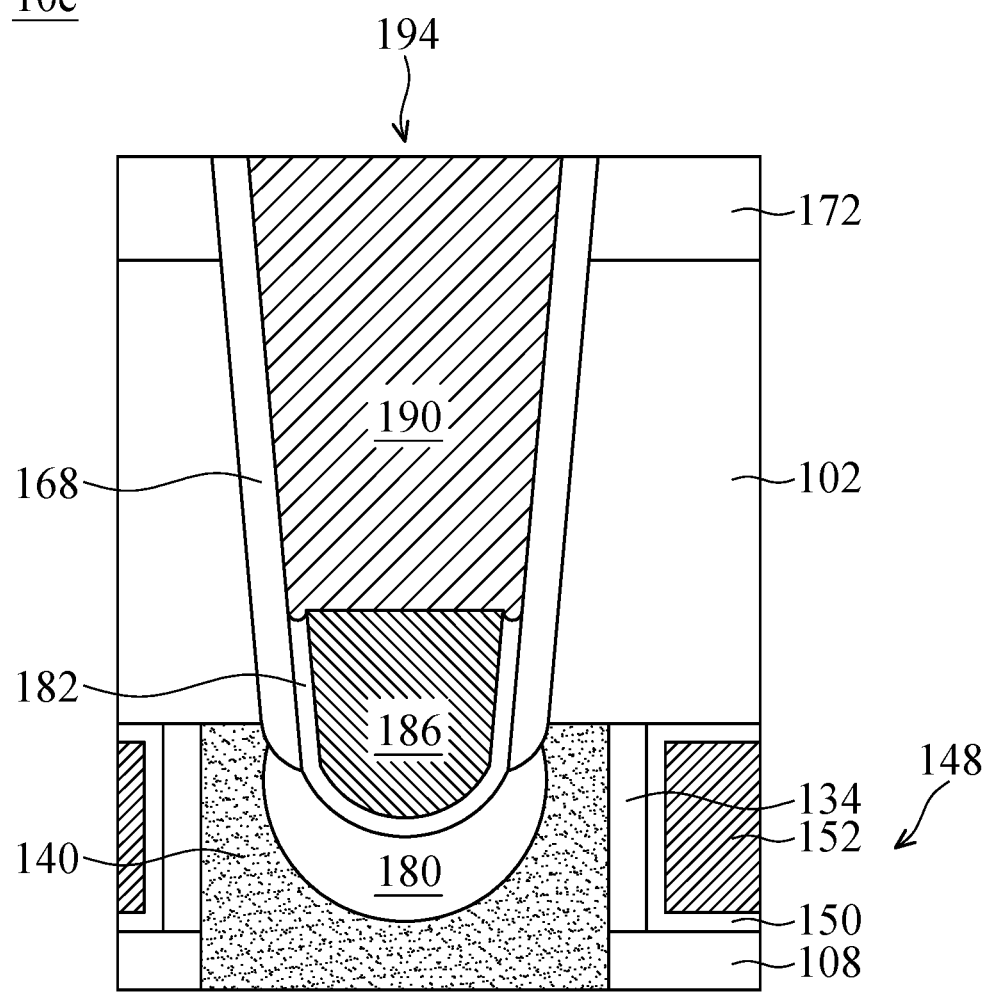
FIG. 6 is an enlarged cross-sectional representation of a semiconductor device structure, in accordance with some embodiments of the disclosure.

Many variations and/or modifications may be made to the embodiments of the disclosure. FIG. 6 is an enlarged cross-sectional representation of a semiconductor device structure 10e, in accordance with some embodiments of the disclosure. Some processes or devices are the same as, or similar to, those described in the embodiments above, and therefore the descriptions of these processes and devices are not repeated herein. The difference from the embodiments described above is that, as shown in FIG. 6 in accordance with some embodiments, the top surface of the first conductive layer 186 is higher than the top surface of the second silicide layer 182.

When etching back the first conductive layer 186, if the etching time is shorter, the top surface of the first conductive layer 186 may be flat. The shape of the top surfaces of the first conductive layer 186 and the second silicide layer 182 may be modified independently by the etching back processes of the first conductive layer 186 and the second silicide layer 182.

By forming the back-side source/drain contact structure 194 by two-step etching back process, the back-side source/drain contact structure 194 may be formed by bottom-up deposition process without void or selective loss. In addition, the first silicide layer 180 may not be damaged, and the contact resistance may be decreased. The first conductive layer 186 may have a flat top surface by modifying the etching time. The top surfaces of each of the first conductive layer 186 and the second silicide layer 182 may be independently modified by the etching time of different etching processes.

As described previously, the back-side source/drain contact structure 194 by two-step etching back process. The resistance may be reduced by using bottom-up deposition process. The two-step etching back process may help to reduce the resistance and defects when forming the bottom-up deposited conductive layer. The shape of the back-side source/drain contact structure 194 may be modified by the process parameter of the two-step etching back process. In some embodiments as shown in FIG. 3A, and implantation process 300 is performed, and the adhesion between the liner layer 168 and the second conductive layer 190 is improved. In some embodiments as shown in FIG. 4A, a barrier layer 196 is formed under the first conductive layer 186 when the first conductive layer is formed by a CVD deposition process. In some embodiments as shown in FIG. 5, the second silicide layer 182 has a flat top surface. In some embodiments as shown in FIG. 6, the top surface of the first conductive layer 186 is higher than the top surface of the second silicide layer 182, and the top surfaces of the first conductive layer 186 and the second silicide layer 182 can be modified independently.

Embodiments of a semiconductor device structure and a method for forming the same are provided. By forming back-side source/drain contact structure by a two-step etching back process, the defects formed in the bottom-up deposition process may be prevented, and the resistance and the yield may be improved.

It should be noted that the gate-all-around (GAA) structure shown in the present disclosure is merely an example, the present disclosure may also be applied to FinFET devices or nanowire devices.

In some embodiments, a method for forming a semiconductor device structure is provided. The method for forming a semiconductor device structure includes forming nanostructures over the front side of the substrate. The method for forming a semiconductor device structure also includes forming a gate structure surrounding the nanostructures. The method for forming a semiconductor device structure also includes forming a source/drain structure beside the gate structure. The method for forming a semiconductor device structure also includes forming a trench though the substrate from the back side of the substrate. The method for forming a semiconductor device structure also includes forming a first silicide layer in contact with the source/drain structure. The method for forming a semiconductor device structure also includes forming a second silicide layer over the first silicide layer and sidewalls of the trench. The method for forming a semiconductor device structure also includes depositing a first conductive material over the second silicide layer. The method for forming a semiconductor device structure also includes etching back the first conductive material. The method for forming a semiconductor device structure also includes etching back the second silicide layer. The method for forming a semiconductor device structure also includes depositing a second conductive material in the trench.

In some embodiments, a method for forming a semiconductor device structure is provided. The method for forming a semiconductor device structure includes forming a fin structure over a first side of a substrate. The method for forming a semiconductor device structure also includes forming a gate structure over the fin structure. The method for forming a semiconductor device structure also includes forming source/drain structures over opposite sides of the gate structure. The method for forming a semiconductor device structure also includes flipping over the substrate. The method for forming a semiconductor device structure also includes forming a hard mask layer over a second side of the substrate. The method for forming a semiconductor device structure also includes forming a trench exposing the source/drain structures from the second side of the substrate. The method for forming a semiconductor device structure also includes forming a liner layer over sidewalls of the trench. The method for forming a semiconductor device structure also includes forming a first silicide layer at a bottom of the trench. The method for forming a semiconductor device structure also includes depositing a second silicide layer in the trench and over the hard mask layer. The method for forming a semiconductor device structure also includes depositing a first conductive layer over the second silicide layer. The method for forming a semiconductor device structure also includes removing the first conductive layer over the hard mask layer and upper sidewalls of the trench. The method for forming a semiconductor device structure also includes removing the second silicide layer to expose the top surface of the hard mask layer and the upper sidewalls of the liner layer. The method for forming a semiconductor device structure also includes depositing a second conductive layer in the trench. The method for forming a semiconductor device structure also includes forming an overburden layer over the second side of the substrate. The method for forming a semiconductor device structure also includes planarizing the second side of the substrate.

In some embodiments, a semiconductor device structure is provided. The semiconductor device structure includes nanostructures formed over a first side of a substrate. The semiconductor device structure also includes a gate structure surrounding the nanostructures. The semiconductor device structure also includes source/drain epitaxial structures formed over opposite sides of the gate structure. The semiconductor device structure also includes a first silicide layer formed at a second side of the source/drain epitaxial structures. The semiconductor device structure also includes a source/drain contact structure comprising a first portion and a second portion formed over the second side of the source/drain epitaxial structures. The first portion of the source/drain contact structure comprises a second silicide layer surrounding a first conductive material, and the second portion of the source/drain contact structure includes a second conductive material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device structure, comprising:
    forming nanostructures over a front side of a substrate;
    forming a gate structure surrounding the nanostructures;
    forming a source/drain structure beside the gate structure;
    forming a trench though the substrate from a back side of the substrate;
    forming a first silicide layer in contact with the source/drain structure;
    forming a second silicide layer over the first silicide layer and sidewalls of the trench;
    depositing a first conductive material over the second silicide layer;
    etching back the first conductive material;
    etching back the second silicide layer; and
    depositing a second conductive material in the trench.

2. The method for forming the semiconductor device structure as claimed in claim 1, further comprising:
    forming a liner layer in the trench before forming the first silicide layer; and
    removing the liner layer over a bottom surface of the trench.

3. The method for forming the semiconductor device structure as claimed in claim 1, further comprising:
    forming a hard mask layer over the back side of the substrate before forming the trench;
    depositing an overburden layer over the second conductive material and the hard mask layer; and
    planarizing the back side of the substrate to expose the hard mask layer.

4. The method for forming the semiconductor device structure as claimed in claim 1, wherein the first silicide layer and the second silicide layer comprise different materials.

5. The method for forming the semiconductor device structure as claimed in claim 1, further comprising:
    implanting a dopant at the back side of the substrate after depositing the second conductive material.

6. The method for forming the semiconductor device structure as claimed in claim 5, wherein the dopant comprises Ge, F, C, or a combination thereof.

7. The method for forming the semiconductor device structure as claimed in claim 1, further comprising:
    forming a barrier layer over the second silicide layer before depositing a first conductive material; and
    etching back the barrier layer when etching back the first conductive material.

8. A method for forming a semiconductor device structure, comprising:
    forming a fin structure over a first side of a substrate;
    forming a gate structure over the fin structure;
    forming source/drain structures over opposite sides of the gate structure;
    flipping over the substrate;
    forming a hard mask layer over a second side of the substrate;
    forming a trench exposing the source/drain structures from the second side of the substrate;
    forming a liner layer over sidewalls of the trench;
    forming a first silicide layer at a bottom of the trench;
    depositing a second silicide layer in the trench and over the hard mask layer;
    depositing a first conductive layer over the second silicide layer;
    removing the first conductive layer over the hard mask layer and upper sidewalls of the trench;
    removing the second silicide layer to expose a top surface of the hard mask layer and upper sidewalls of the liner layer;
    depositing a second conductive layer in the trench;
    forming an overburden layer over the second side of the substrate; and
    planarizing the second side of the substrate.

9. The method for forming the semiconductor device structure as claimed in claim 8, wherein the second conductive layer is deposited using a bottom-up deposition process.

10. The method for forming the semiconductor device structure as claimed in claim 8, wherein the first conductive layer and the second silicide layer are removed using different chemicals.

11. The method for forming the semiconductor device structure as claimed in claim 8, wherein the second conductive layer protrudes over the hard mask layer after depositing the second conductive layer.

12. The method for forming the semiconductor device structure as claimed in claim 8, wherein the second conductive layer has a curved upper surface before planarizing the second side of the substrate.

13. The method for forming the semiconductor device structure as claimed in claim 8, wherein the first conductive layer at the bottom of the trench is thicker than the first conductive layer over the hard mask layer after depositing a first conductive layer.

14. A method for forming a semiconductor device structure, comprising:
    forming a source/drain epitaxial structure over a front side of a substrate;
    forming a source/drain contact structure over the source/drain epitaxial structure;
    forming a trench though the substrate from a back side of the substrate to expose the source/drain epitaxial structure;
    forming a first silicide layer at a bottom of the trench;
    forming a second silicide layer over the first silicide layer;
    forming a first conductive layer surrounded by the second silicide layer; and
    forming a second conductive layer on the first conductive layer and the second silicide layer.

15. The method for forming the semiconductor device structure as claimed in claim 14, further comprising:
    forming a third silicide layer between the source/drain contact structure and the source/drain epitaxial structure.

16. The method for forming the semiconductor device structure as claimed in claim 14, wherein a top surface of the first conductive layer is higher than a top surface of the second silicide layer.

17. The method for forming the semiconductor device structure as claimed in claim 14, wherein the first conductive layer has a concave top surface.

18. The method for forming the semiconductor device structure as claimed in claim 14, wherein the first conductive layer has a flat top surface.

19. The method for forming the semiconductor device structure as claimed in claim 14, wherein the second silicide layer has a flat top surface.

20. The method for forming the semiconductor device structure as claimed in claim 14, wherein the first conductive layer is separated from the first silicide layer by the second silicide layer.

* * * * *